United States Patent
Kim

(10) Patent No.: US 12,125,527 B2
(45) Date of Patent: Oct. 22, 2024

(54) APPARATUS AND METHOD FOR CONTROLLING GRADUAL CONDUCTANCE CHANGE IN SYNAPTIC ELEMENT

(71) Applicant: Jun-sung Kim, Seongnam-si (KR)

(72) Inventor: Jun-sung Kim, Seongnam-si (KR)

(*) Notice: Subject to any disclaimer, the term of this patent is extended or adjusted under 35 U.S.C. 154(b) by 179 days.

(21) Appl. No.: 17/628,280

(22) PCT Filed: Jul. 30, 2020

(86) PCT No.: PCT/KR2020/010056
§ 371 (c)(1),
(2) Date: Jan. 19, 2022

(87) PCT Pub. No.: WO2021/020899
PCT Pub. Date: Feb. 4, 2021

(65) Prior Publication Data
US 2022/0270675 A1    Aug. 25, 2022

Related U.S. Application Data

(63) Continuation of application No. 16/526,331, filed on Jul. 30, 2019, now Pat. No. 10,943,649.
(Continued)

(51) Int. Cl.
*G11C 11/00* (2006.01)
*G06N 3/065* (2023.01)
(Continued)

(52) U.S. Cl.
CPC ............. *G11C 11/54* (2013.01); *G06N 3/065* (2023.01); *G06N 3/08* (2013.01); *G11C 11/1673* (2013.01);
(Continued)

(58) Field of Classification Search
CPC . G11C 11/54; G11C 11/1673; G11C 11/1675; G11C 13/004; G11C 13/0069;
(Continued)

(56) References Cited

U.S. PATENT DOCUMENTS

| | | |
|---|---|---|
| 2015/0106311 A1 | 4/2015 | Birdwell et al. |
| 2015/0170025 A1 | 6/2015 | Wu et al. |

(Continued)

FOREIGN PATENT DOCUMENTS

| | | |
|---|---|---|
| KR | 20180116094 | 10/2018 |
| KR | 10-2019-0022622 | 3/2019 |

(Continued)

OTHER PUBLICATIONS

Olga Krestinskaya et al., "Neuromemristive circuits for edge computing: A review", IEEE transactions on neural networks and learning systems 31.1 (2019): 4-23, XP055614484, DOI: 10.1109/TNNLS.2019.2899262, Nov. 28, 2018.
(Continued)

*Primary Examiner* — Hien N Nguyen
(74) *Attorney, Agent, or Firm* — LEX IP MEISTER, PLLC

(57) ABSTRACT

The present invention provides a memory apparatus capable of causing a gradual resistance change for information processing in an analog manner to a synaptic element for implementing a neuromorphic system. To this end, the present invention provides a memory apparatus including: a memory array including a plurality of memory cells capable of selectively storing logic states and a plurality of bit lines and word lines connected to the plurality of memory cells; a controller for controlling a writing step and a reading step; a writing unit; and a reading unit, wherein the controller selects, in the writing step, one or more memory cells from
(Continued)

among the plurality of memory cells through the writing unit, sequentially applies a writing voltage thereto to allow the logic states to be written therein, and applies, in the reading step, a reading voltage to the one or more memory cells, which are selected to have the logic states written therein, through the reading unit so as to determine synaptic weights through a sum of currents flowing through the one or more memory cells so that the selected one or more memory cells are allowed to be recognized to operate as one synaptic element.

The present invention also provides a method for determining a synaptic weight in a memory apparatus including a memory array including a plurality of memory cells capable of selectively storing logic states, bit lines and word lines connected to the plurality of memory cells, the method including: (a) selecting one or more memory cells from among the plurality of memory cells, and sequentially applying a writing voltage to write logic states therein; (b) applying a reading voltage to the one or more memory cells that has been selected to have the logic states written therein; and (c) determining, by the applied reading voltage, a synaptic weight through a sum of currents flowing through the one or more memory cells that has been selected to have the logic states written therein, wherein the selected one or more memory cells are recognized to operate as one synaptic element.

4 Claims, 17 Drawing Sheets

Related U.S. Application Data

(60) Provisional application No. 62/880,342, filed on Jul. 30, 2019.

(51) Int. Cl.
  *G06N 3/08* (2023.01)
  *G11C 11/16* (2006.01)
  *G11C 11/54* (2006.01)
  *G11C 13/00* (2006.01)

(52) U.S. Cl.
  CPC ........ *G11C 11/1675* (2013.01); *G11C 13/004* (2013.01); *G11C 13/0069* (2013.01); *G11C 2013/005* (2013.01); *G11C 2013/009* (2013.01)

(58) Field of Classification Search
  CPC ........ G11C 2013/005; G11C 2013/009; G06N 3/065; G06N 3/08; G06N 3/063
  See application file for complete search history.

(56) References Cited

U.S. PATENT DOCUMENTS

| | | | |
|---|---|---|---|
| 2016/0284400 A1* | 9/2016 | Yakopcic | G11C 13/0002 |
| 2018/0260696 A1 | 9/2018 | Suda et al. | |
| 2019/0147330 A1* | 5/2019 | Otsuka | G11C 13/0069 |
| | | | 706/29 |
| 2019/0158097 A1 | 5/2019 | Lu et al. | |
| 2019/0318232 A1 | 10/2019 | Cruz-Albrecht et al. | |
| 2021/0150317 A1* | 5/2021 | Hou | G11C 13/004 |
| 2021/0183438 A1* | 6/2021 | Lee | G06N 3/065 |
| 2022/0366976 A1* | 11/2022 | Hwang | G11C 5/147 |

FOREIGN PATENT DOCUMENTS

| | | |
|---|---|---|
| KR | 20190075682 | 7/2019 |
| KR | 20190085785 | 7/2019 |

OTHER PUBLICATIONS

Injune Yeo et al., "Stuck-at-fault tolerant schemes for memristor crossbar array-based neural networks" IEEE Transactions on Electron Devices 66.7 (2019): 2937-2945, XP011729916, Doi: 10.1109/TED.2019.2914460, Jul. 2019.

EPO, Search Report of Application No. 20846109.5, dated Jun. 29, 2023 & Jul. 18, 2023.

* cited by examiner

[Fig. 1]
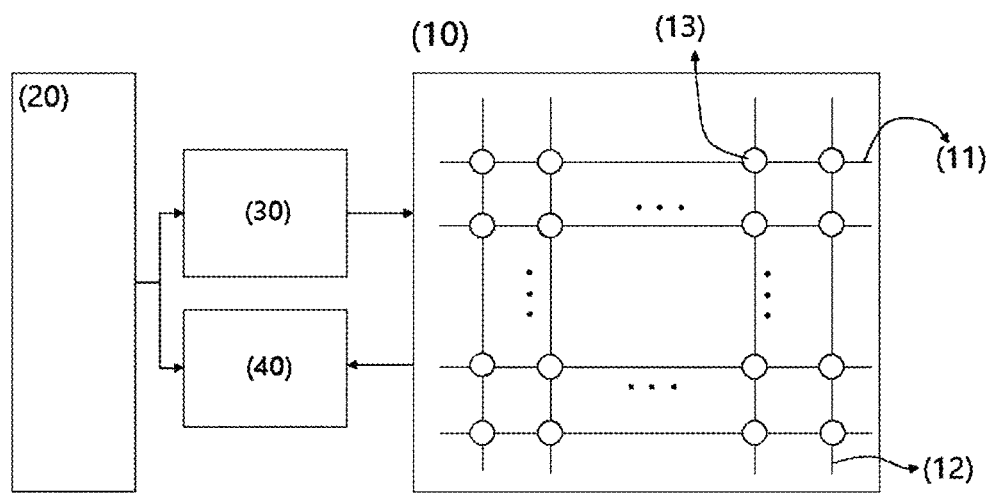

[Fig. 2]
(a)
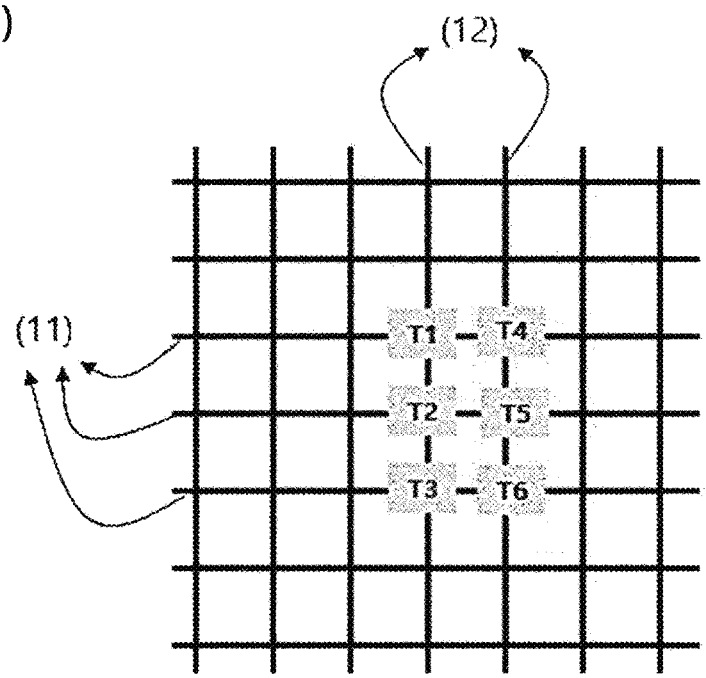
(b)
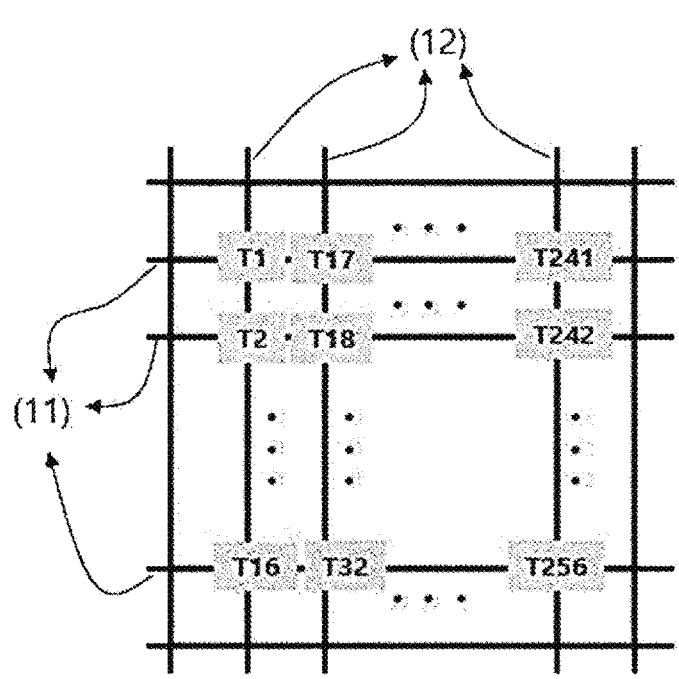

[Fig. 3]
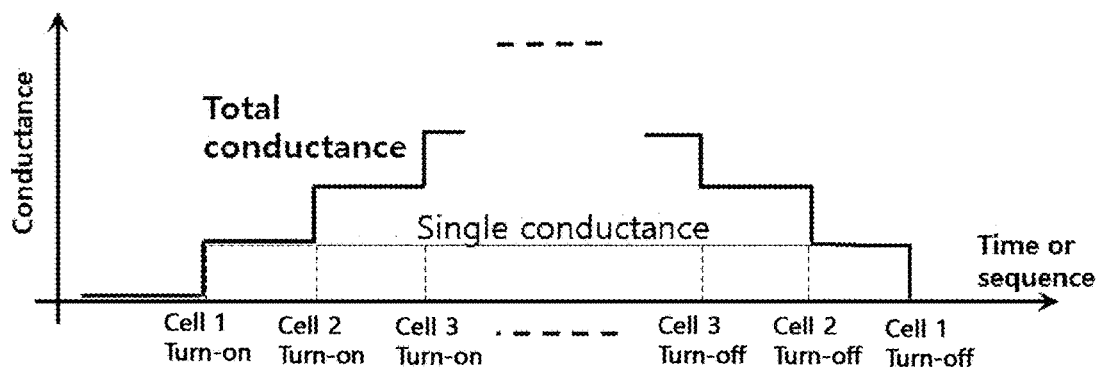
[Fig. 4]
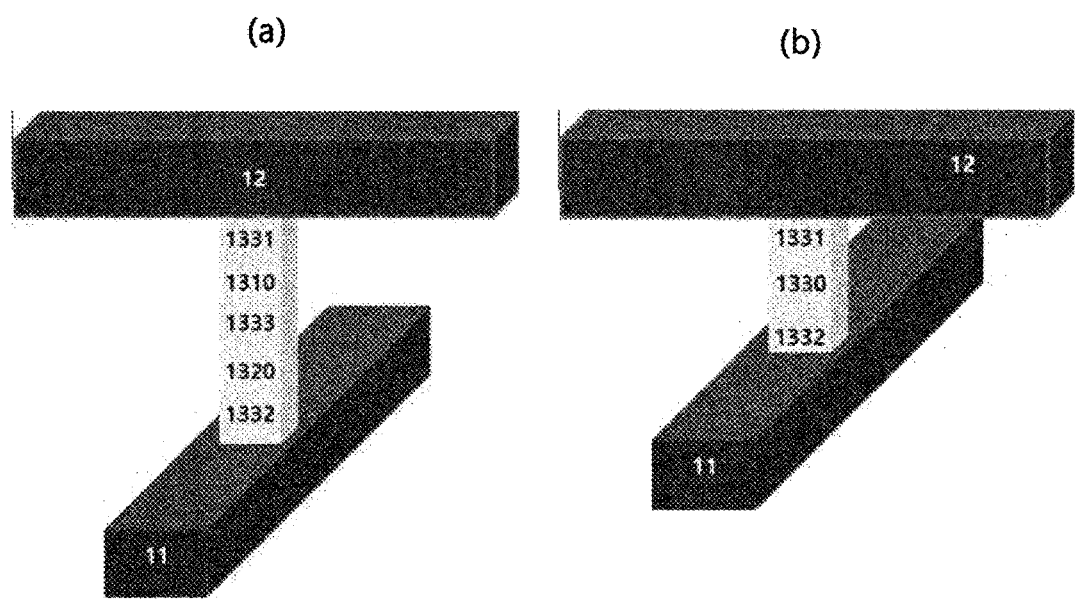

[Fig. 5]
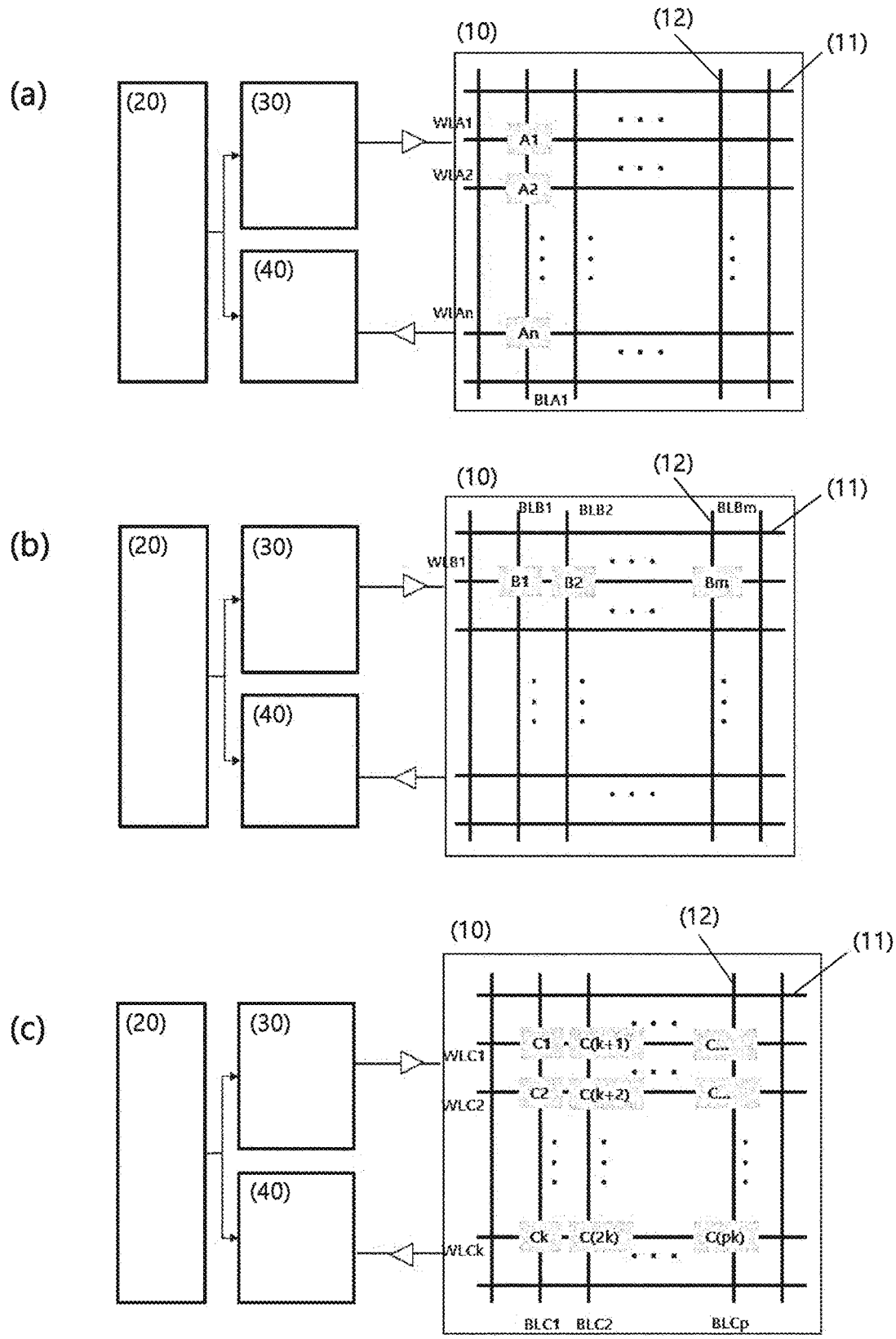

[Fig. 6]
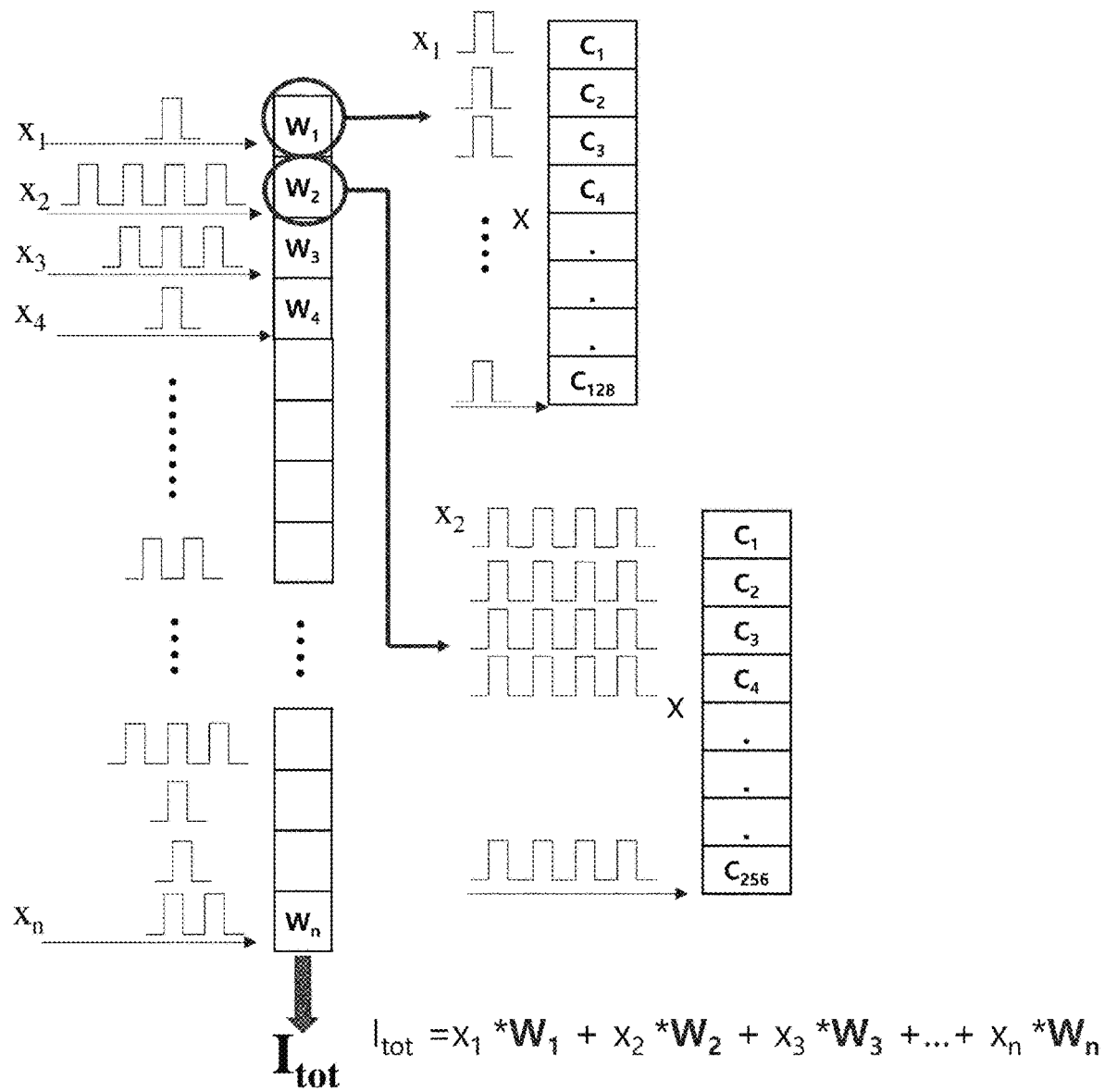

[Fig. 7]
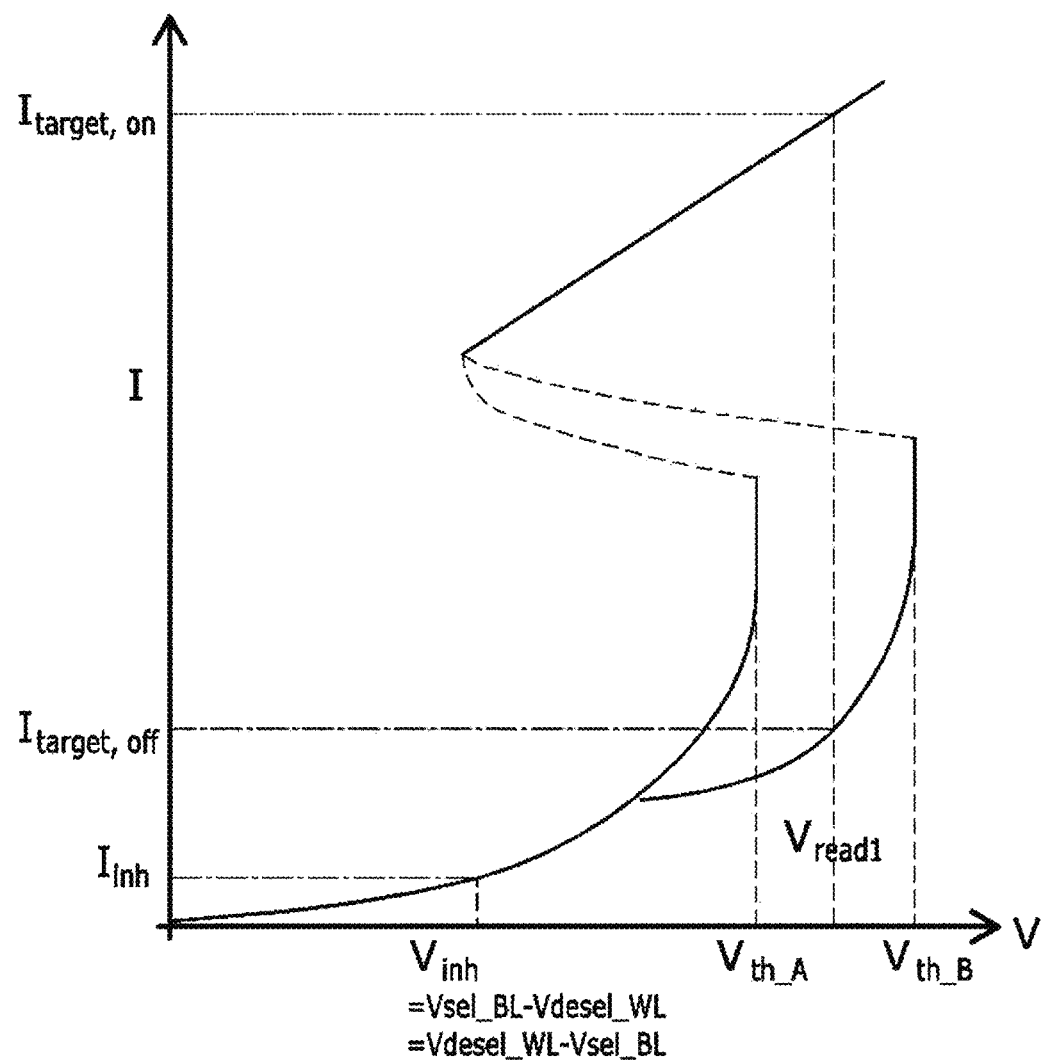

[Fig. 8]
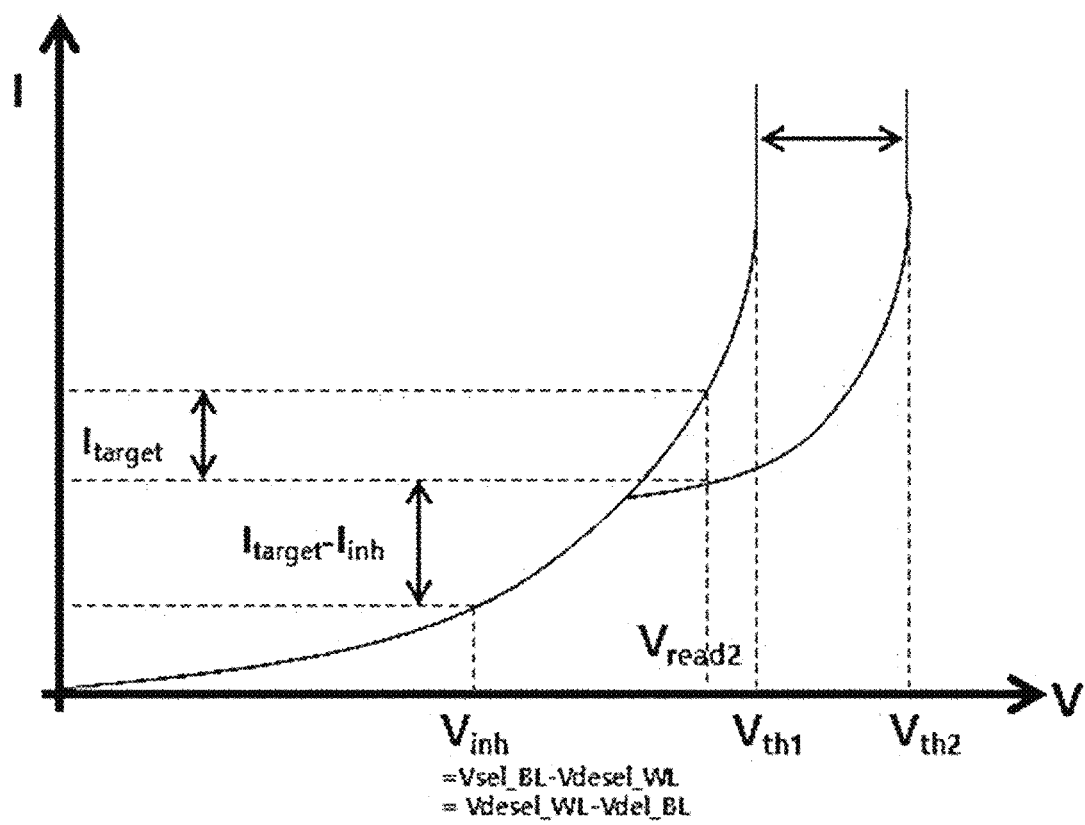

[Fig. 9]
(a)
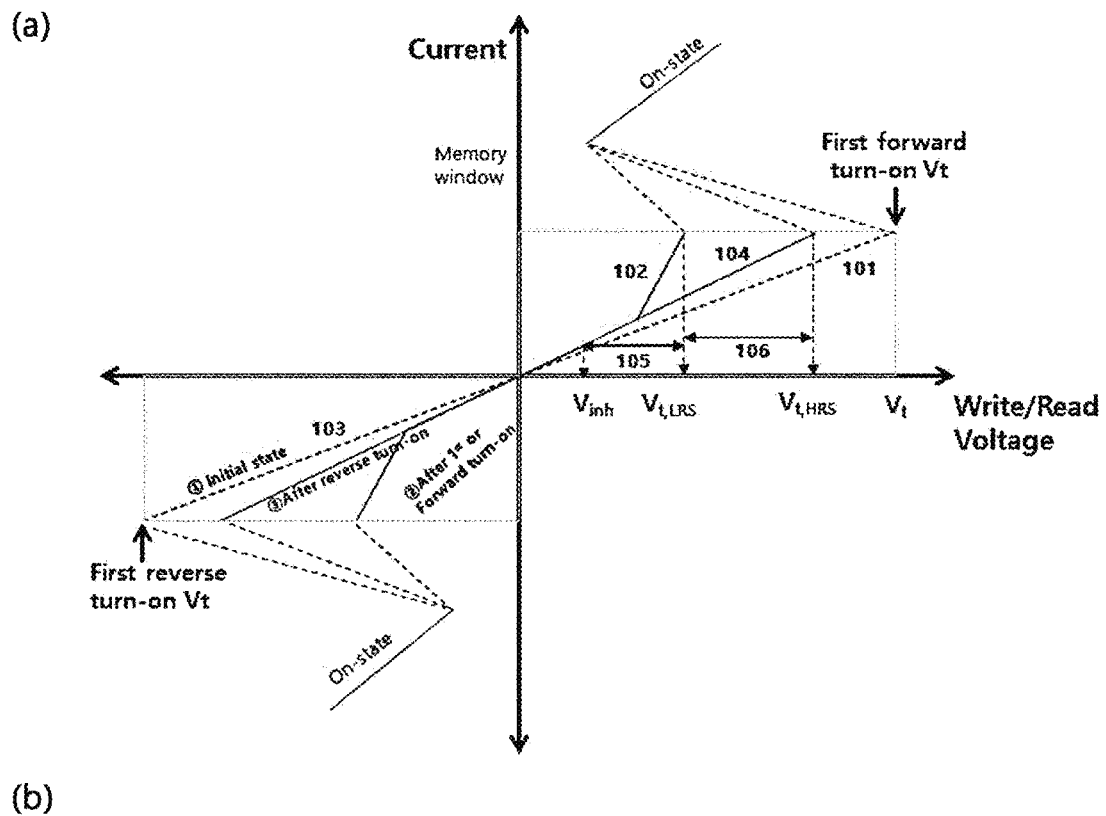
(b)
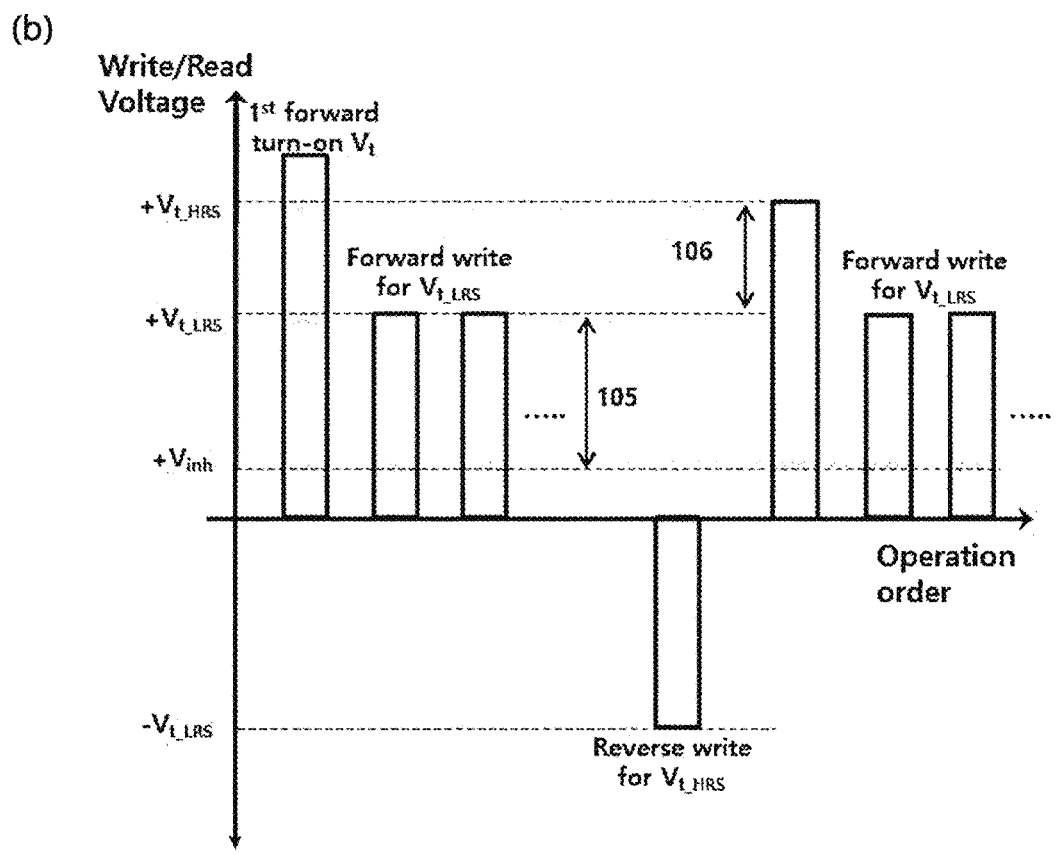

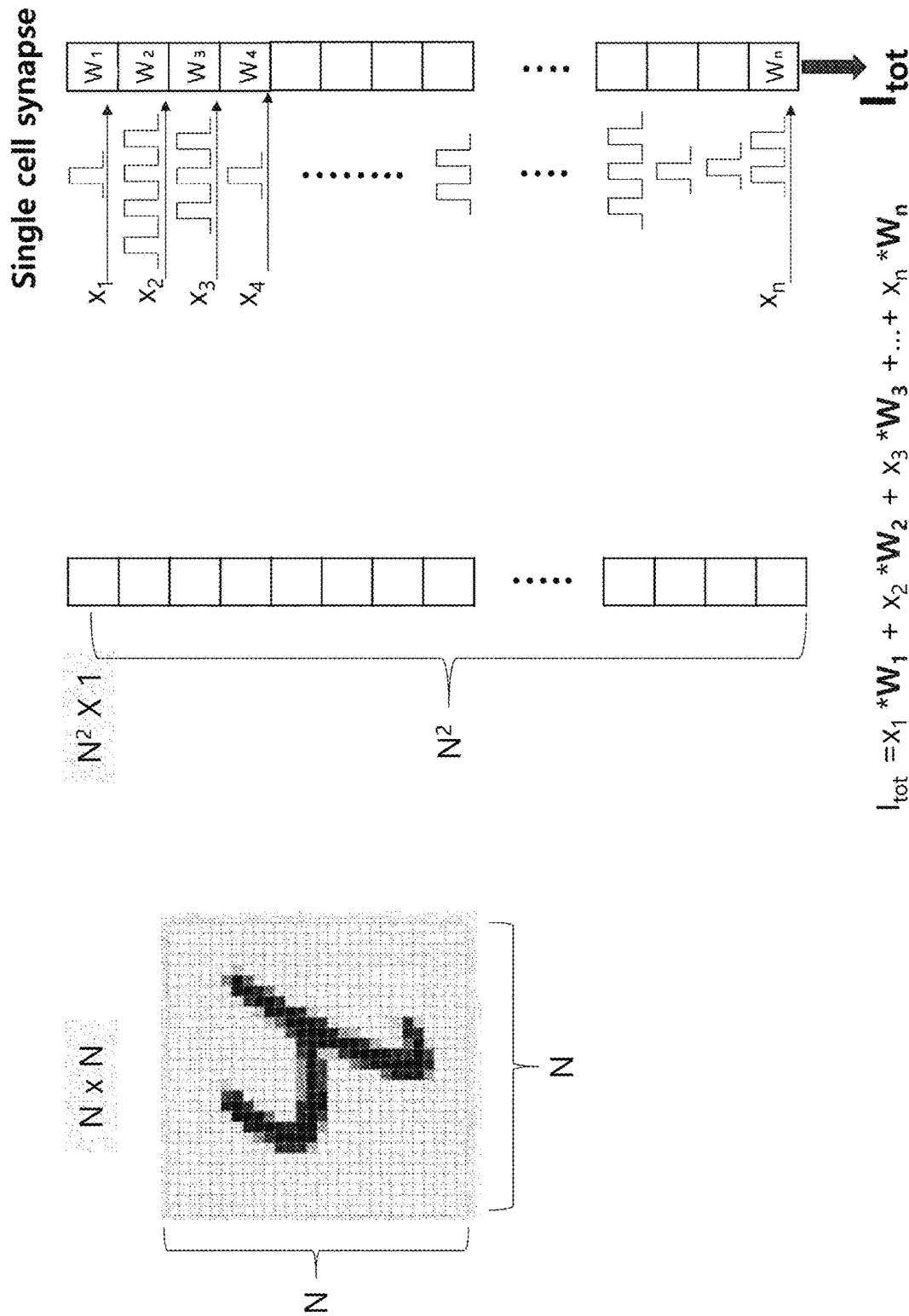
[Fig. 10]

[Fig. 11]
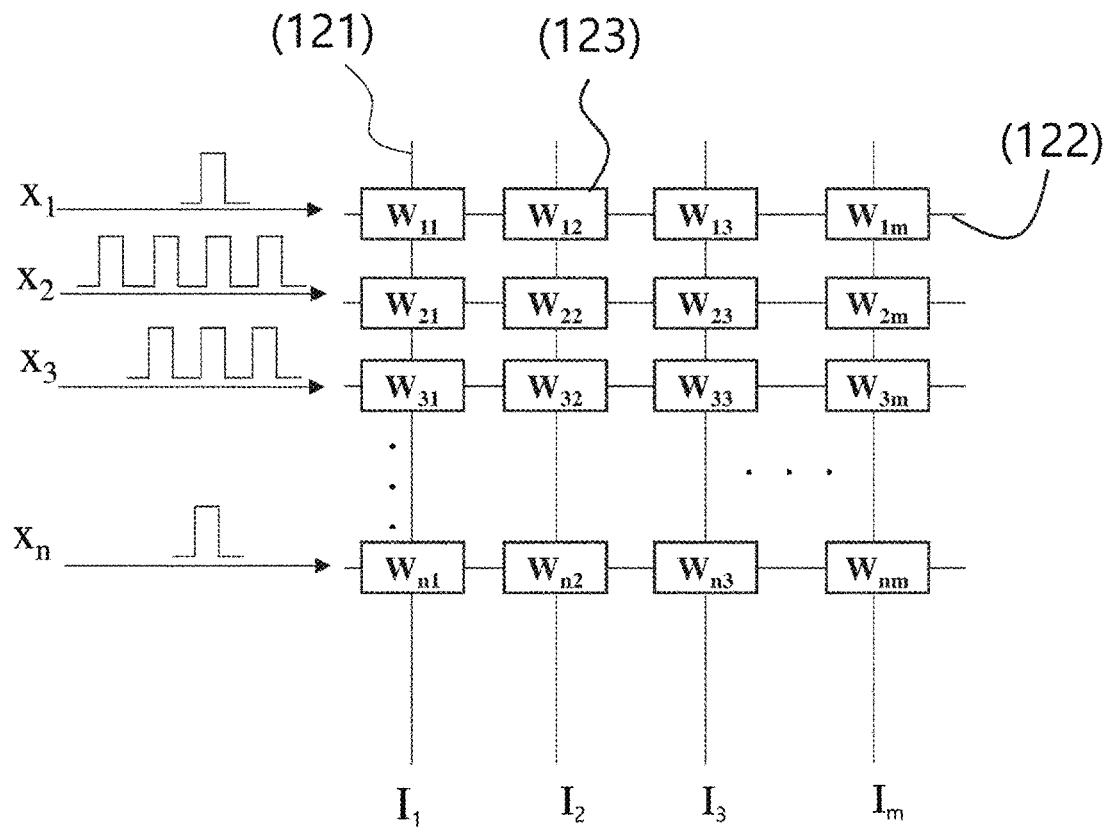
$$I_1 = x_1 * W_{11} + x_2 * W_{21} + x_3 * W_{31} + \ldots + x_n * W_{n1}$$
$$I_2 = x_1 * W_{12} + x_2 * W_{22} + x_3 * W_{32} + \ldots + x_n * W_{n2}$$
$$\vdots$$
$$I_m = x_1 * W_{1m} + x_2 * W_{2m} + x_3 * W_{3m} + \ldots + x_n * W_{nm}$$

【Fig. 12】
(a)
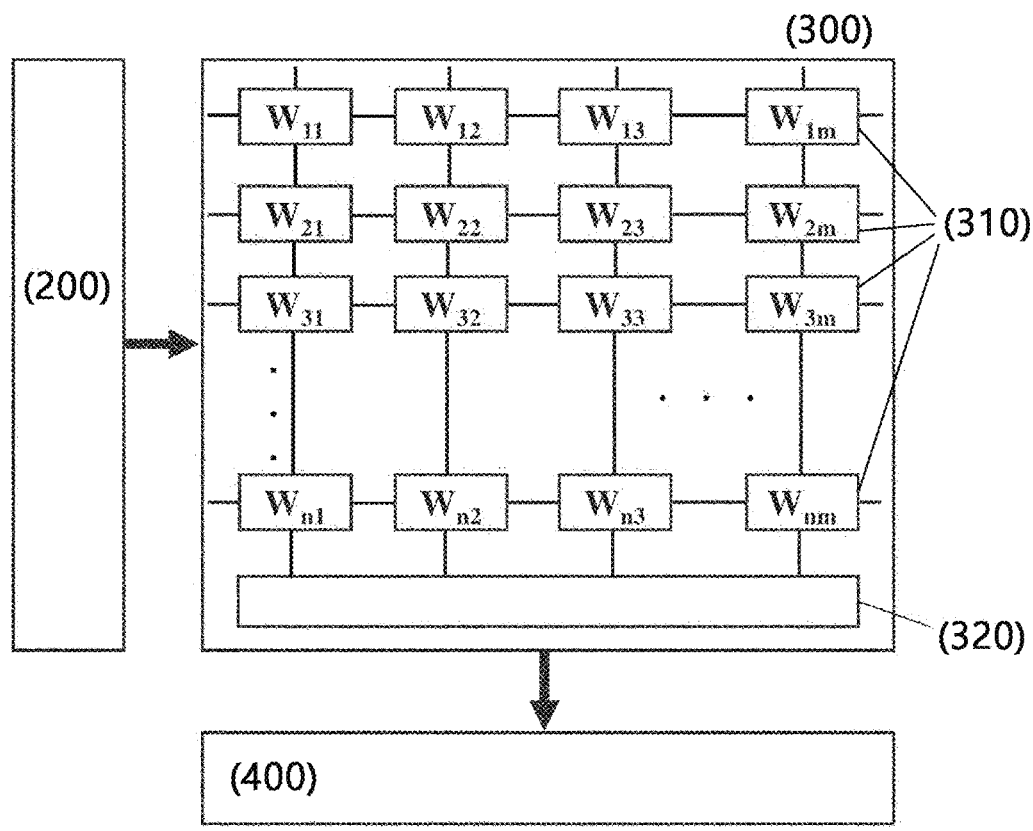
(b)
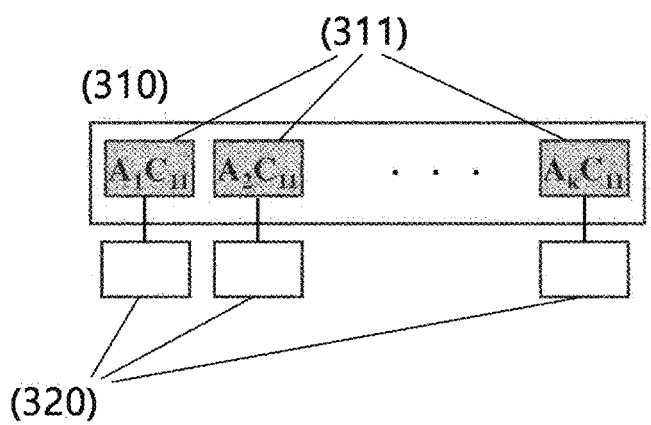

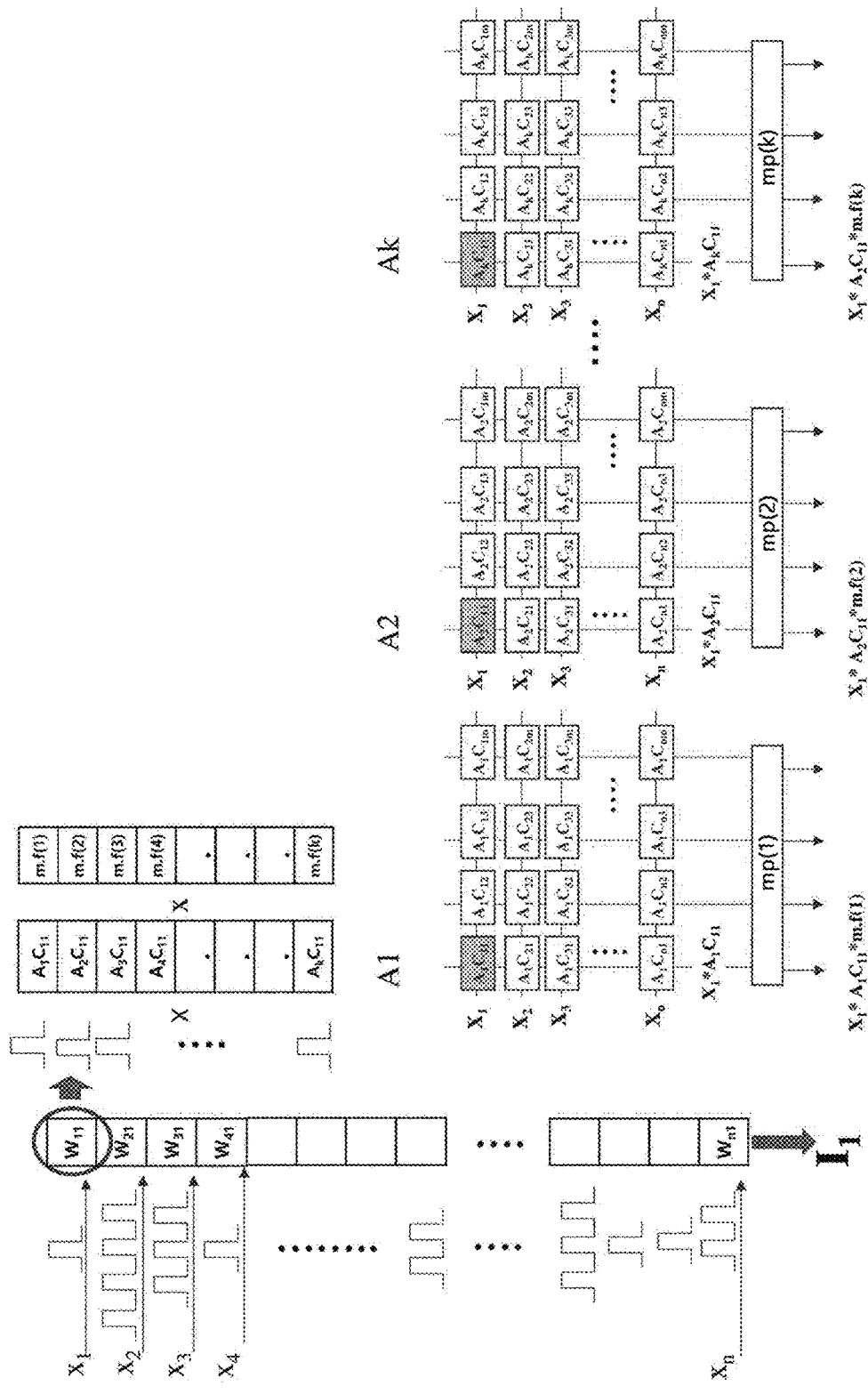
[Fig. 13]

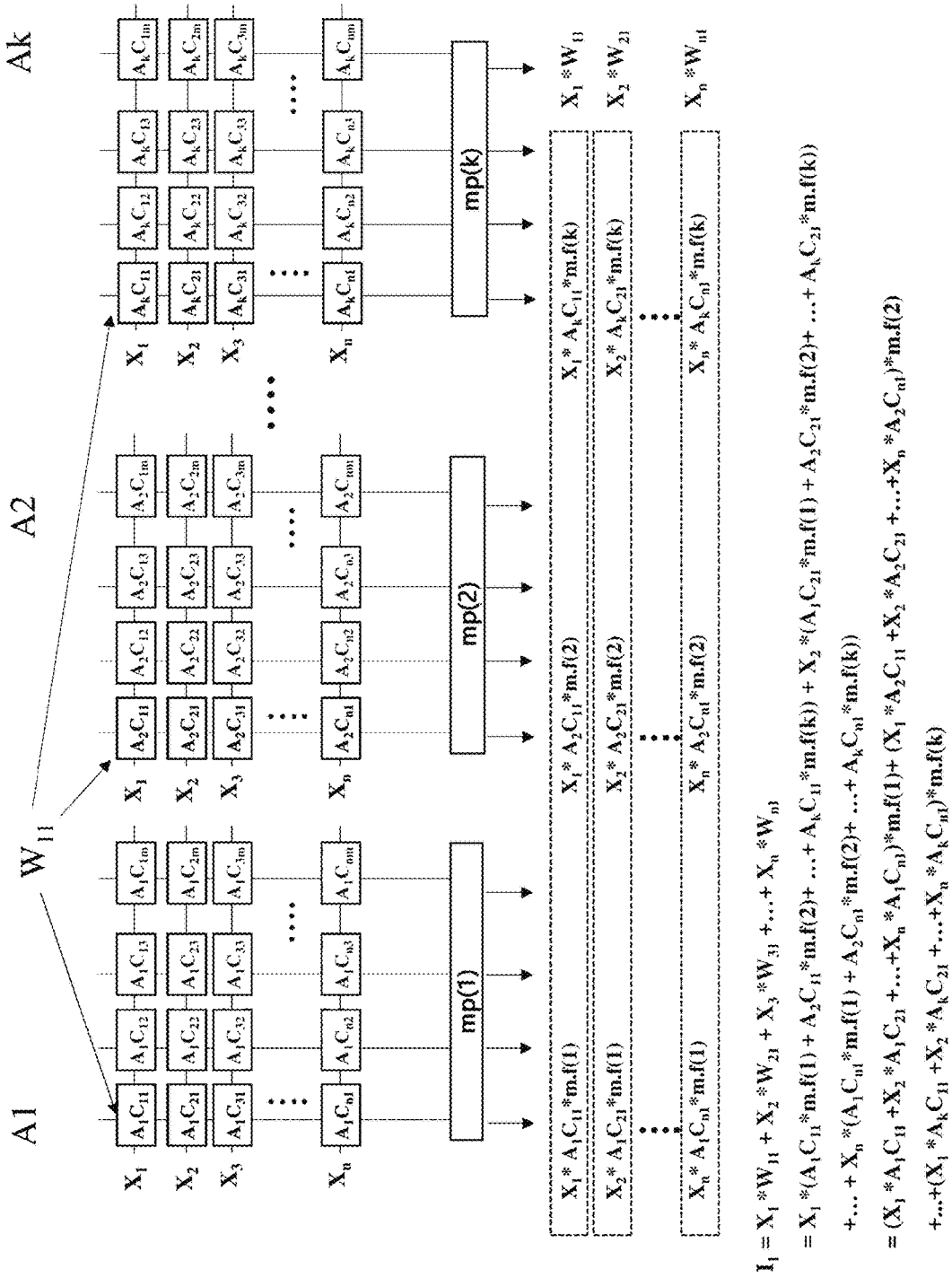

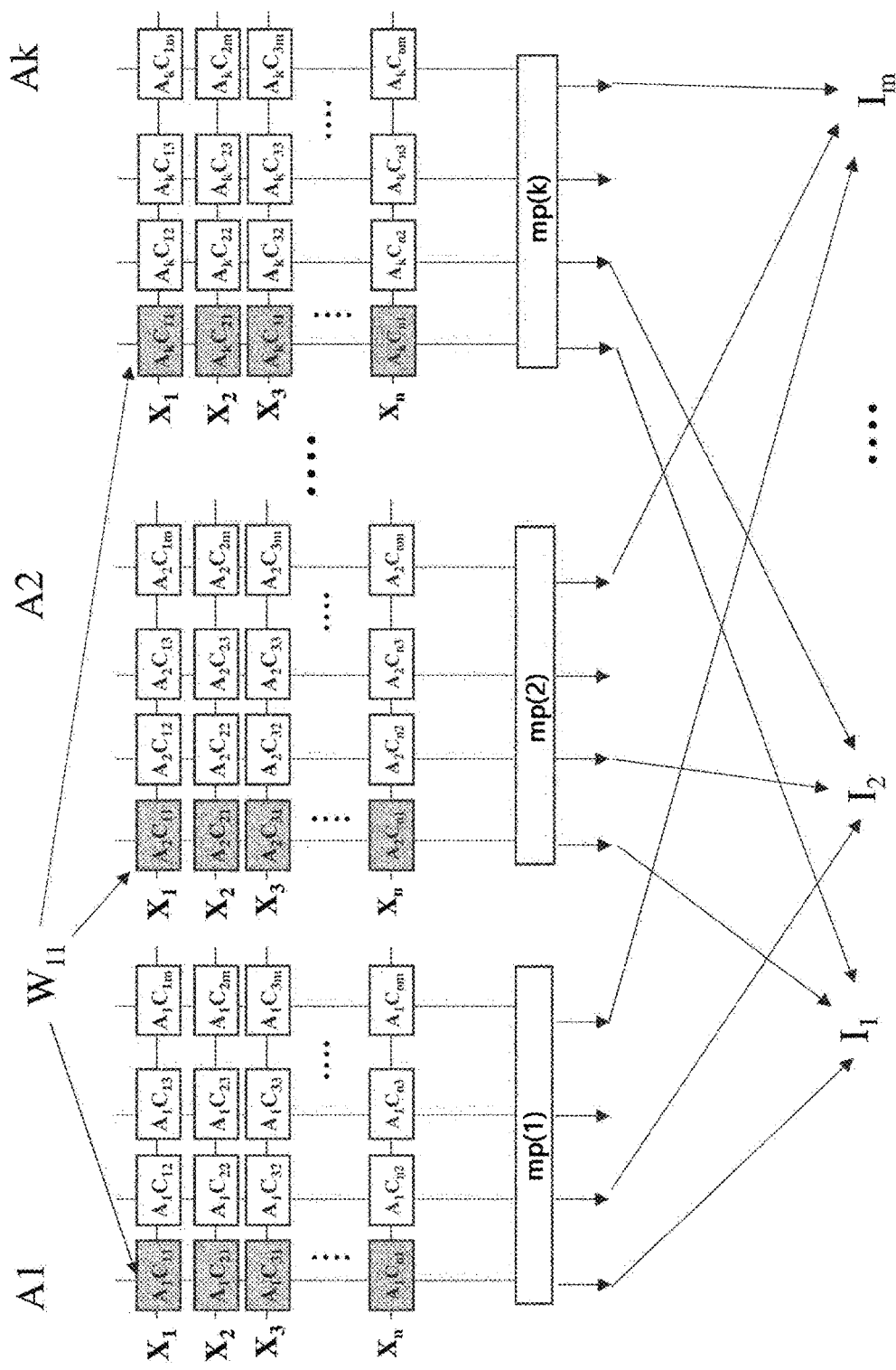
[Fig. 15]

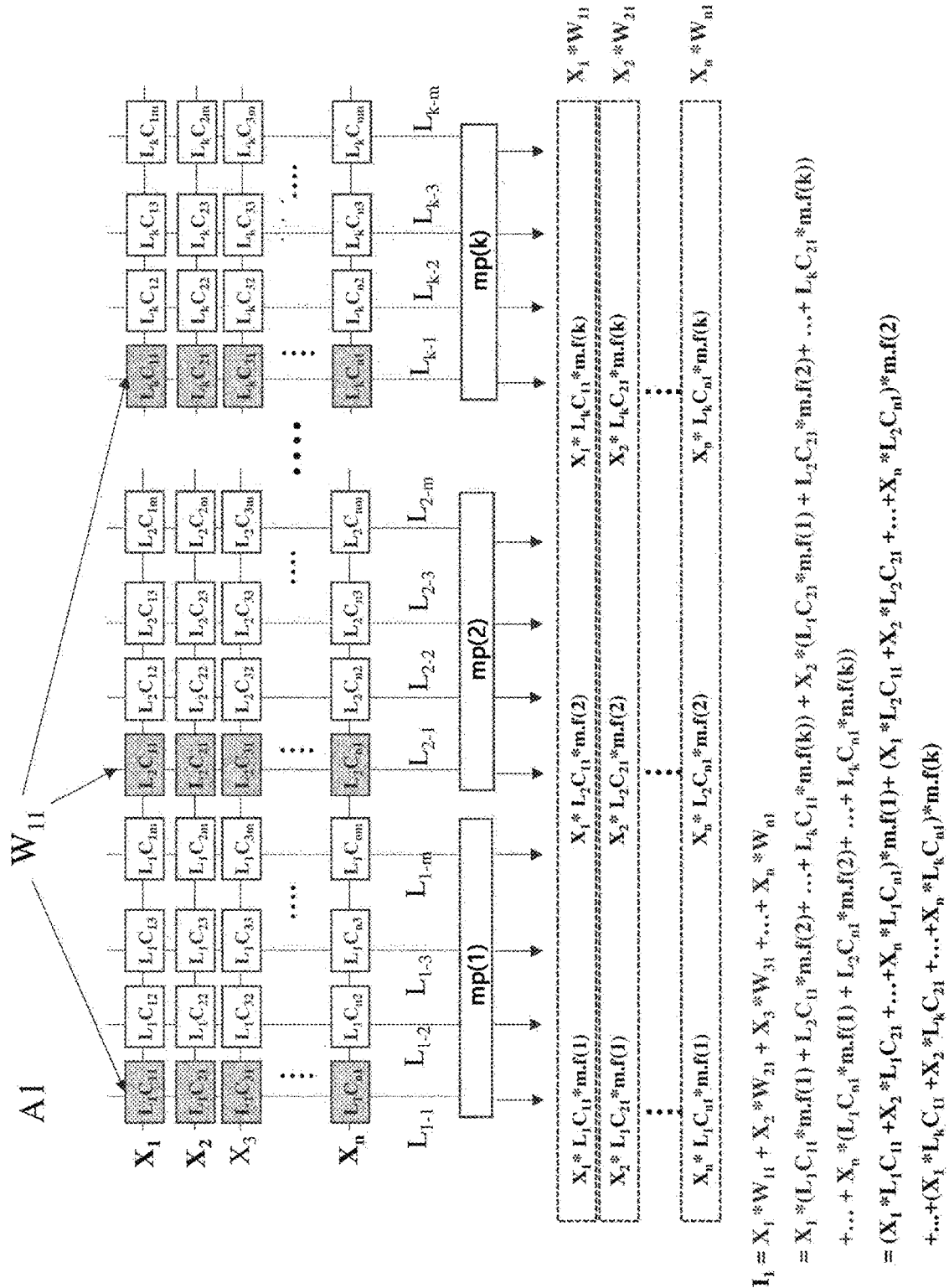

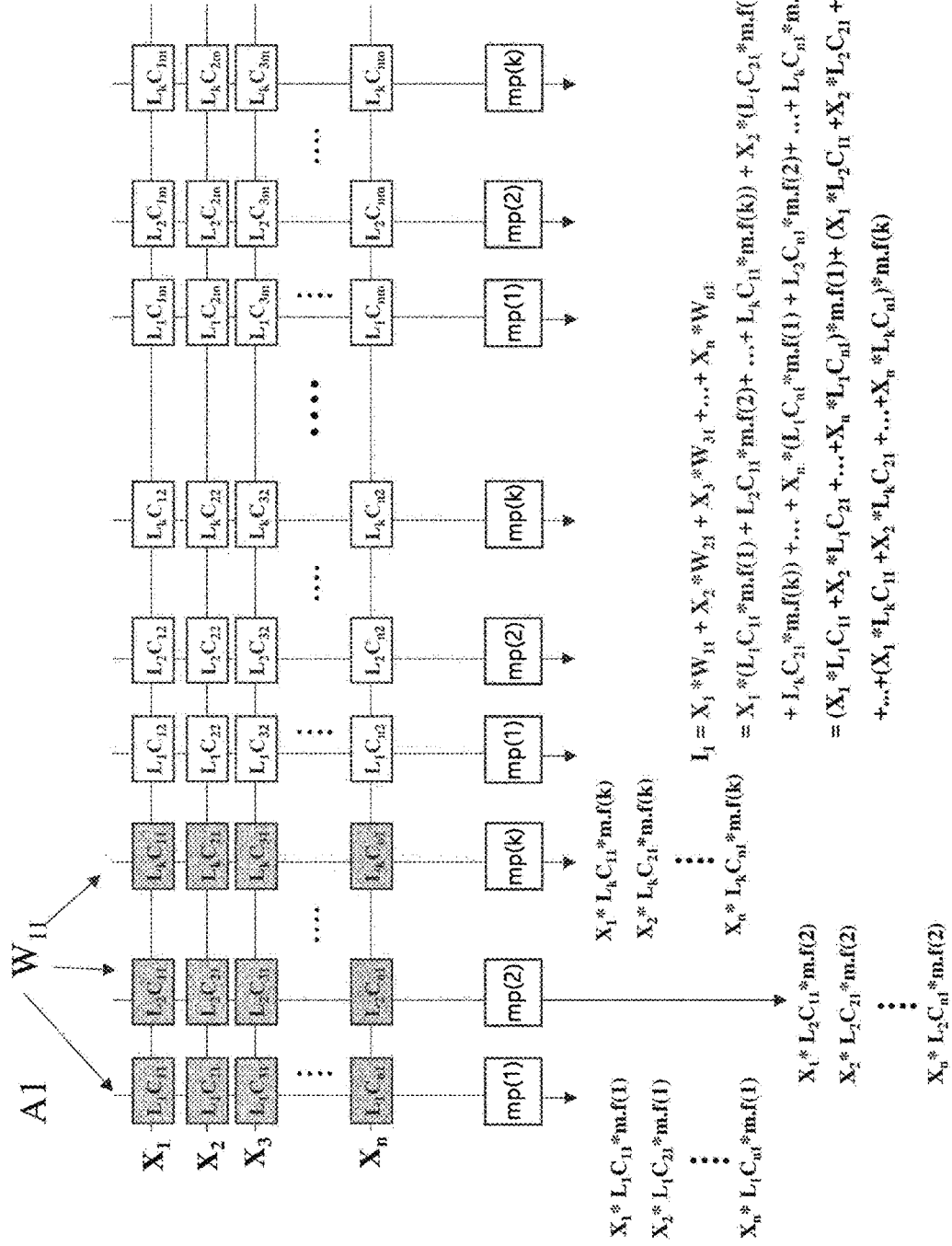

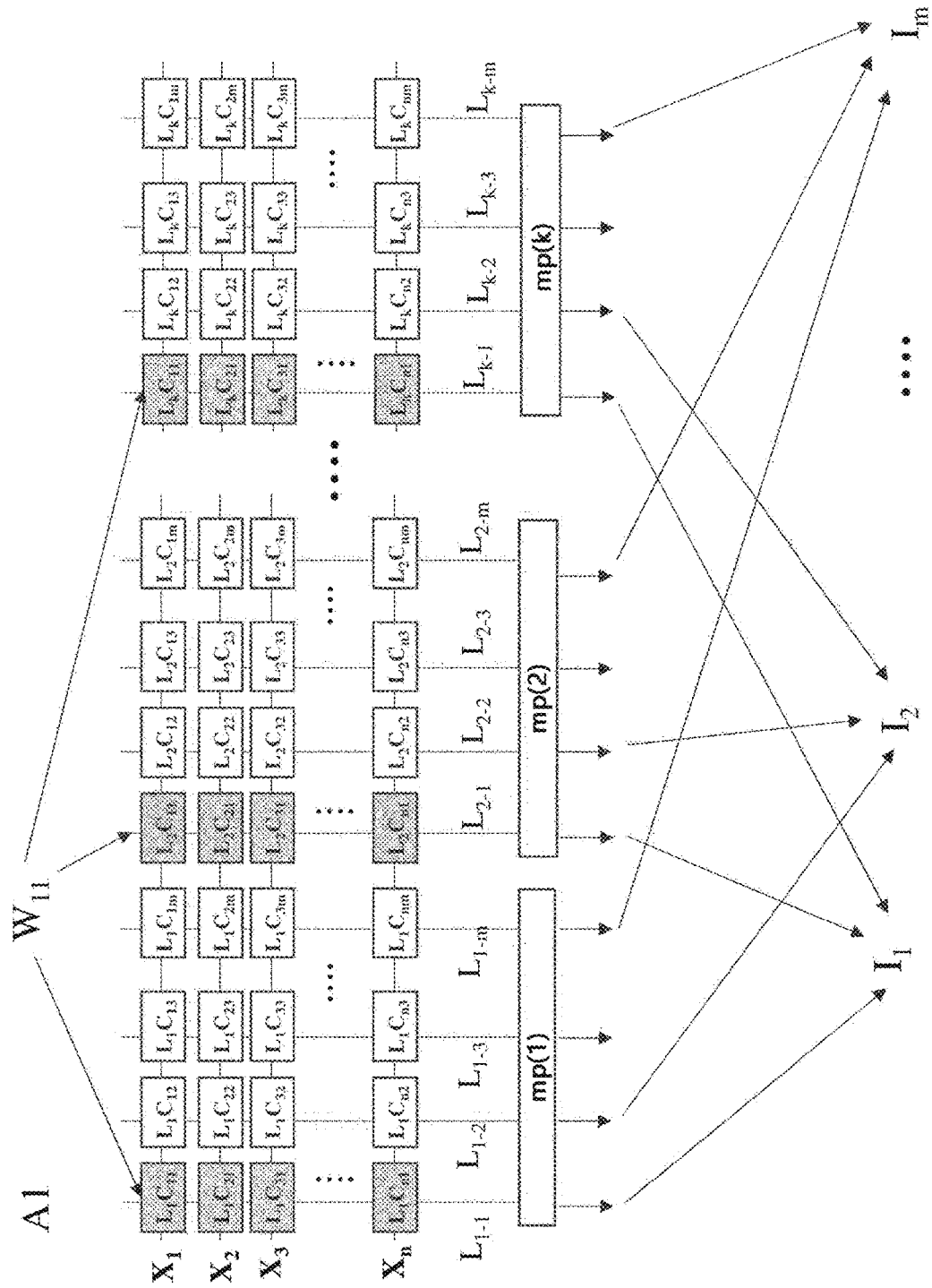
[Fig. 18]

APPARATUS AND METHOD FOR CONTROLLING GRADUAL CONDUCTANCE CHANGE IN SYNAPTIC ELEMENT

TECHNICAL FIELD

The present invention relates to a memory apparatus capable of controlling a gradual conductance change in implementing a neuromorphic system. More particularly, the present invention relates to a memory apparatus in which one or more memory cells selected from a memory array are recognized to operate as one synaptic element.

BACKGROUND ART

Artificial intelligence semiconductor industry may be spoken as being in its embryonic stage. Semiconductor design and manufacturing companies recently start to release test products or products of early version. These test products or products of early version are all the CMOS-based first generation artificial intelligence semiconductor products, and are not different from the existing semiconductor products from the perspective of a material. Therefore, it is expected that a new material will be introduced and utilized in the second generation artificial intelligence semiconductor.

For the second generation artificial semiconductor having the degree of integration similar to a biological neural network, an artificial synapse that has all the essential characteristics of a biological synapse is required to be implemented as one element. A synapse of a biological system is accompanied with a change in synaptic weight in a procedure for processing a signal delivered from a neuron, and exhibits learning and storage functions through the same. Accordingly, an artificial synaptic element aims to simulate the biological synapse to output a change in synaptic weight as a current (or resistance) so as to exhibit learning and storage functions. To this end, it is very important to develop an element in which a controllable and distinguishable gradual current (or resistance) change occurs. In the most ideal artificial synaptic element, the gradual current (or resistance) change may occur in proportion to the number of applied pulses accurately.

In order to achieve this purpose, various artificial synaptic elements have been proposed and manufactured. In a technology that has been researched in the semiconductor field for manufacturing the synaptic element, a low resistance state is distinguished from a high resistance state in a memory array such as an RRAM, a PRAM, or an MRAM in which the resistance may be changed, and information on the distinguished states is stored in each cell. Research has been performed in a direction in which a high resistance change in a digital on or off type is implemented and a logic state of the cell in the memory array is read according to such a resistance change.

However, in order to implement the artificial synaptic element, not only one element is required to have various resistance states, but the resistance states are also required to be controllable. Researches and developments on such an element using the above-described RRAM or PRAM element are underway, but the developed results are asymmetric and lack reproducibility. In addition, it is not enough to make a distinguishable resistance state and perform simultaneous control.

INVENTION OF THE INVENTION

Technical Problem

An object of the present invention is to provide a memory apparatus capable of causing a gradual resistance change for information processing in an analog manner to a synaptic element for implementing a neuromorphic system.

Technical Solution

To achieve the above object, an aspect of the present invention provides a memory apparatus including: a memory array including a plurality of memory cells capable of selectively storing logic states and a plurality of bit lines and word lines connected to the plurality of memory cells; a controller for controlling a writing step and a reading step; a writing unit; and a reading unit, wherein the controller selects, in the writing step, one or more memory cells from among the plurality of memory cells through the writing unit, sequentially applies a writing voltage thereto to allow the logic states to be written therein, and applies, in the reading step, a reading voltage to the one or more memory cells, which are selected to have the logic states written therein, through the reading unit so as to determine synaptic weights through a sum of currents flowing through the one or more memory cells so that the selected one or more memory cells are allowed to be recognized to operate as one synaptic element.

Another aspect of the present invention provides a method for determining a synaptic weight in a memory apparatus including a memory array including a plurality of memory cells capable of selectively storing logic states, bit lines and word lines connected to the plurality of memory cells, the method including: (a) selecting one or more memory cells from among the plurality of memory cells, and sequentially applying a writing voltage to write logic states therein; (b) applying a reading voltage to the one or more memory cells that has been selected to have the logic states written therein; and (c) determining, by the applied reading voltage, a synaptic weight through a sum of currents flowing through the one or more memory cells that has been selected to have the logic states written therein, wherein the selected one or more memory cells are recognized to operate as one synaptic element.

Another aspect of the present invention provides a neuromorphic system including: an input signal unit that generates an input signal; a synaptic section that includes a plurality of synaptic units receiving the signal of the input signal unit and generating a current according to a set weight and a multiplier amplifying the current generated in the synaptic unit; and an output signal unit that generates an output signal by receiving the current generated from the synaptic section, wherein each of the synaptic units includes a plurality of memory cells connected to each other and capable of selectively storing logic states, and an amplification factor is set in each of the plurality of memory cells, and the current flowing through the plurality of memory cells by the input signal is amplified by the multiplier by the amplification factor.

Another aspect of the present invention provides a method of operation of a synaptic device for a neuromorphic system in the neuromorphic system which includes a plurality of synaptic units, the synaptic units including a plurality of memory cells which are connected to each other and positioned in a plurality of memory arrays having a cross point structure which includes input electrode lines and output electrode lines crossing each other, the plurality of memory cells selectively storing logic states, the method including: (a) setting an amplification factor for each of the plurality of memory arrays; (b) selecting and combining one or more memory cells from each of the plurality of memory arrays for which the amplification factor is set, and setting the plurality of synaptic units including the plurality of memory cells; (c) applying an input signal to the plurality of synaptic units; (d) measuring currents flowing through the memory cells of the synaptic unit by the applied input signal for each memory array and adding the currents; and (e) amplifying the current measured for each memory array according to the set amplification factor of the memory array, and measuring a sum of the currents amplified in the respective memory arrays.

Another aspect of the present invention provides a method of operation of a synaptic device for a neuromorphic system in the neuromorphic system which includes a plurality of synaptic units, the synaptic units including a plurality of memory cells which are connected to each other and positioned in one memory array having a cross point structure which includes input electrode lines and output electrode lines crossing each other, the plurality of memory cells selectively storing logic states, the method including: (a) setting an amplification factor for each output electrode line of the memory array; (b) selecting and combining one or more memory cells connected to the output electrode line for which the amplification factor is set, and setting the plurality of synaptic units including the plurality of memory cells; (c) applying an input signal to the plurality of synaptic units; (d) measuring currents flowing through the memory cells of the synaptic unit by the applied input signal for each output electrode line; and (e) amplifying the current measured for each output line according to the set amplification factor of the output electrode line, and measuring a sum of the currents amplified in the respective output electrode lines.

Advantageous Effects

According to the present invention, a synaptic element capable of controlling a gradual resistance change through a highly linear proportion through a method for determining a synaptic weight may be provided in the memory apparatus and the memory array.

BRIEF DESCRIPTION OF THE DRAWINGS

FIG. 1 illustrates a configuration diagram of a memory apparatus according to the present invention;

FIG. 2 illustrates an example in which a plurality of memory cells are selected in a memory apparatus according to the present invention;

FIG. 3 illustrates that a gradual conductance change occurs in a memory apparatus according to the present invention;

FIG. 4 illustrates a configuration example of a memory cell applied to a memory apparatus according to the present invention;

FIG. 5 illustrates an example in which a plurality of memory cells are selected in a memory apparatus according to the present invention;

FIG. 6 is a diagram illustrating a method for determining a synaptic weight according to the present invention;

FIG. 7 is a diagram illustrating a typical reading method in a memory array of a cross point structure in which a memory cell having a switching function is included;

FIG. 8 is a diagram illustrating a reading method according to the present invention for a memory array of a cross point structure in which a memory cell having a switching function is included;

FIG. 9 is a diagram illustrating a writing and reading method according to the present invention for a memory array of a cross point structure in which a memory cell having a selective memory element is included;

FIG. 10 is a diagram illustrating an inference method through a vector-matrix multiplication operation;

FIG. 11 is a diagram illustrating a vector-matrix multiplication operation using a memory array of a cross point structure;

FIG. 12 is a configuration diagram of a neuromorphic system according to the present invention;

FIG. 13 is a diagram illustrating a neuromorphic system according to the present invention;

FIG. 14 is a diagram illustrating a neuromorphic system and an operation method thereof according to the present invention;

FIG. 15 is a diagram illustrating a neuromorphic system and an operation method thereof according to the present invention;

FIG. 16 is a diagram illustrating a neuromorphic system and an operation method thereof according to the present invention;

FIG. 17 is a diagram illustrating a neuromorphic system and an operation method thereof according to the present invention; and FIG. 18 is a diagram illustrating a neuromorphic system and an operation method thereof according to the present invention.

MODE FOR CARRYING OUT THE INVENTION

Hereinafter configurations and operations of embodiments of the present invention will be described with accompanying drawings. In the following description, detailed descriptions of well-known functions or constructions will be omitted since they would obscure the invention in unnecessary detail. In addition, when an element is referred to as "comprising" or "including" a component, it does not preclude another component but may further include the other component unless the context clearly indicates otherwise.

According to the present invention, a memory apparatus is provided which includes a memory array including a plurality of memory cells, each of which being able to selectively store a logic state, bit lines and word lines connected to the plurality of memory cells, a controller for controlling a writing step and a reading step, a writing unit, and a reading unit, wherein, in the writing step, the controller selects one or more memory cells from among the plurality of memory cells through the writing unit, and sequentially applies writing voltages to write logic states. In the reading step, the controller applies a reading voltage to one or more cells that are selected by the reading unit to have the logic states written therein, and determines synaptic weights through the sum of currents flowing through the memory cells. Accordingly, the selected one or more memory cells are caused to be recognized to operate as one synaptic element As illustrated in FIG. 1, the memory array 10 may have a cross-point structure in which the word lines 11 that are horizontal address lines and the bit lines 12 that are vertical address lines are disposed in a grid structure, and the memory cells 13 are disposed at cross points of the word lines 11 and the bit lines 12. However, this is for convenience of explanation and the present invention is not limited thereto.

The controller 20 selects, through the writing unit 30, a part of the plurality of memory cells 13 from the memory array 10 of the cross point structure, and sequentially applies a voltage to the selected memory cells to program logic states. The number of the selected memory cells may be determined according to a weight of the synaptic element. For example, when the memory cell may store a logic state of one bit and 128 synaptic weights are necessary, 128 memory cells are selected. When the selected 128 memory cells are turned on, a current is flowed to read 128 synaptic weights in the reading step. In addition, in case where 256 synaptic weights are necessary, 256 memory cells are selected and these selected memory cells are programmed to be on state in the writing step. Then, 256 synaptic weights may be read in the reading step.

An example of the memory cells selected in this way is shown in FIG. 2. FIG. 2A illustrates that 6 memory cells positioned at a 3×2 matrix in the memory array 10 are selected to form one synaptic element, and FIG. 2B illustrates that one synaptic element is formed through 256 memory cells positioned in a 16×16 matrix.

The synaptic element in FIG. 2B may represent 256 synaptic weights through 256 cells (T1 to T256). Since it is preferable that there are 256 synaptic weights in order to implement an accurate image for input image information in processing image information, it is very important to represent such synaptic weights.

In addition, the number of the selected memory cells may be preferably $2^n$ on the basis of the binary system based in a computer. Accordingly, the number of selected memory cells is preferably one among 1, 2, 4, 8, 16, 32, 64, 128, 256, 1024, or 2048. When the number of memory cells exceeds 2048, the number of memory cells selected from the array becomes too many and a control therefor becomes difficult. Therefore, the number of memory cells may be preferably 2048 or smaller.

In the reading step, the total sum of the currents is measured which flow through the memory array 10 by a voltage applied to the memory array 10, and the synaptic weights in the memory array 10 may be determined through this total sum. The total sum of the currents becomes differed according to the number of memory cells that are selected in this way to have logic states written therein, and the synaptic weights may be determined in various ways.

Such a current (conductance) change is shown in FIG. 3. In the memory apparatus according to the present invention, the total sum of the currents gradually changes according to the number of the selected memory cells, and the change is linearly proportional to the number of the selected memory cells. Since also having the excellent symmetry when the conductance rises and falls, the memory cells are suitable to be applied as a synaptic element.

In addition, the plurality of memory cells capable of storing the logic states in the present invention may be a memory apparatus capable of storing a logic state of one bit or more. When the logic state is not just on or off, but has several stages, a large synaptic weight may be represented even when the number of memory cells is small. For example, when each memory cell represents only on or off, the number of selected memory cells, which is required to represent 256 synaptic weights, is 256. On the other hand, when the memory cell is formed of a variable resistance element and may represent a four-stage resistance state, the 256 synaptic weights may be represented with 64 memory cells.

Each of the plurality of memory cells, which may store the logic state, may include a non-volatile memory element and a selector element. The non-volatile memory is necessary so as to store the logic state at low power in a memory cell, and each of the memory cells 13 requires to include the selector element in order to sequentially select memory cells and write the logic states thereto in the writing step, and measure the sum of the currents flowing through the programmed memory cells in the reading step.

The non-volatile memory element may be any one among a Flash Memory, a resistive random access memory (RRAM), phase change random access memory (PRAM), or a magnetic random access memory (MRAM). In particular, the non-volatile memory element may be a variable resistance element such as an RRAM, a PRAM, or an MRAM. This variable resistance element may represent various resistance states according to an applied writing voltage and/or current pulse, and store the logic states of one or more bits through the same.

Furthermore, the selector element may be any one among a transistor, a diode, or a two-terminal switching element. Each memory cell may be individually selected through the selector element included therein to pass the writing and reading steps.

In particular, the selector element may be a two-terminal switching element. Application of the two-terminal switching element as the selector element for selecting the memory cell may raise the degree of integration and reduce power consumption. The two-terminal switching element may be any one among an Ovonic threshold switch, a transition metal oxide switch, a mixed ionic electronic conductor (MIEC) switch, a complementary resistance switch, or a doped amorphous silicon.

In addition, the plurality of memory cells in the present invention may include a selective memory element that may store the logic state. The selective memory element means an element having both the non-volatile memory characteristics and the selector element characteristics. A chalcogenide material without a phase change may also be a variable resistance element, and have unique switch characteristics that cause a constant resistance change to occur around a threshold voltage.

In this way, when a variable resistance element is used which includes a chalcogenide material without a phase change like the existing Ovonic threshold switch element, one or more memory cells may be selected through the switching characteristics and each logic state may be stored through the variable resistance characteristics.

Such an element may be represented as a selective memory element, and in this case, an additional memory element or a selector element is not necessary. Accordingly, a high density memory apparatus is enabled and power consumption may be reduced. As such a chalcogenide material, an In—Ge—As—Se alloy, a Te—Se alloy, an As—Se alloy, a Ge—Te alloy, a Ge—Se alloy, an As—Se—Te alloy, a Ge—As—Se alloy, a Ge—As—Sb alloy, a Ge—Sb—Te alloy, a Ge—Sb—Se alloy, a Ge—As—Te alloy, a Si—Ge—As—Se alloy, a Si—Te—As—Ge alloy, an In—Sb—Te alloy, an In—Sb—Se alloy, an In—Ge—As alloy, an In—Ge—Te alloy, an In—Te alloy, or the like may be used. However, besides the above-described materials, a material through which a logic state may be stored and a switching function is enabled according to a resistance change is also adoptable.

An example of the memory cell 13 as described above is illustrated in FIG. 4. For reference, the shape and configuration of each memory cell may be modified in various ways. For example, the selector element or the memory element may be omitted, or an electrode may be omitted. Alternatively, positions of the selector element and the memory element may be switched.

FIG. 4A illustrates a memory cell including a memory element and a selector element. A word line 11, which is one among access lines to the memory cell, vertically passes the plane and a bit line 12 passes the plane in parallel. A memory cell 13 is disposed between these vertically crossing the word line 11 and the bit line 12. Electrodes 1331 and 1332 are disposed between the memory element 1310 and the selector element 1320 connected with the word line 11 and the bit line 12. Between the electrodes 1331 and 1332, the memory element 1310, the selector element 1320, and an electrode 1333 for connecting therebetween are included. The memory element 1310 of the memory cell 13 may be any one among non-volatile memories such as a flash memory, an RRAM, a PRAM, or an MRAM, and the selector element 1320 may be any one among a transistor, a diode, or a two-terminal switching element. For example, the memory element 1310 may be any one among a flash memory, an RRAM, a PRAM, or an MRAM, and the selector element 1320 may be a transistor. As another example, the memory element 1310 may be any one among a RRAM, a PRAM, or an MRAM, and the selector element 1320 may be a two-terminal switching element. Here, the two-terminal switching element may be an Ovonic threshold switch.

In addition, the memory cell 13 may include a selective memory element. FIG. 4B illustrates an example that the memory cell 13 includes a selective memory element 1330 and electrodes 1331 and 1332. The selective memory element 1330 may have a chalcogenide material without a phase change, through which a memory cell is enabled to be selected using unique switching characteristics and a logic state may be written using variable resistance characteristics that appear according to a writing condition. An example of this selective memory element 1330 may be an Ovonic threshold switching element including the chalcogenide material. Although being typically connected with an RRAM, PRAM or the like to be used as a selector element, the Ovonic threshold switching element may be solely used to exhibit both the variable resistance characteristics and a selection function.

The chalcogenide material may be an alloy including In—Ge—As—Se.

In addition, the writing unit 30 according to the present invention is a memory apparatus including a DC counter. The controller 20 sequentially selects one or more memory cells from the memory array 10 through the writing unit 30 that includes the DC counter, and sequentially programs logic states. There may be one or more DC counters.

Furthermore, according to the present invention, the reading unit 40 provides a memory apparatus including an analog-to-digital converter ADC. The ADC is a device for converting a consecutive physical amount into a digital value, and, by using the ADC, the controller 20 may determine the synaptic weights through the flow of the current flowing through the entire memory array 10.

The one or more memory cells, which have been selected to have logic states programmed therein in the writing step, may be a memory apparatus in which all the memory cells are connected to one bit line among the bit lines. When the selected memory cells are connected to the one bit line and only a current flowing through the connected bit line is measured, a current flowing through the entire memory array may be measured, which is efficient in terms of apparatus configuration.

In addition, the present invention may provide a memory apparatus in which the one or more cells, which have been selected to have the logic states programmed therein in the writing step, are connected with one of the word lines. Similarly, only a current flowing through the connected word line may be measured, which is highly efficient in terms of apparatus configuration.

FIG. 5 illustrates configuration examples of various synaptic elements. These are only for convenience of explanation, and the present invention is not limited thereto. The numbers of column lines and row lines included in the memory cell array may be changed as necessary.

FIG. 5A shows a structure in which memory cells that are selected to have the logic states written therein, namely, the memory cells A1 to An forming one synaptic element are all connected to one identical bit line BLA1. In this way, when the memory cells A1 to An forming one synaptic element are connected to one bit line, the controller 20, in the writing step, applies a voltage through a plurality of word lines WLA1 to WLAn and one bit line BLA1 to have the logic states sequentially stored in the memory cells A1 to An. The writing unit 30 may cause the voltage to be sequentially applied to the memory cells A1 to An through the DC counter so that the logic states are written therein. Here, one or more DC counters may be connected to the word lines to which the memory cells A1 to An are connected, and control selective writing.

Thereafter, in the reading step, the controller 20 causes the reading unit 40 to determine the synaptic weights through the sum of the currents flowing through the memory cells A1 to An, namely, the synaptic elements. The reading unit 40 may include an ADC to measure the sum of the currents at one time, and when the selected cells are all connected to one bit line, the ADC may be connected to the bit line to assist the sum of the currents to be measured. Such an ADC may be a sense amplifier.

FIG. 5B shows a structure in which memory cells that are selected to have the logic states written therein, namely, memory cells B1 to Bm forming one synaptic element are all connected to one identical word line WLB1. In this way, when the memory cells B1 to Bm forming one synaptic element are connected to one word line, the controller 20, in the writing step, applies a voltage through a plurality of bit lines BLB1 to BLBm and one word line WLB1 to have the logic states sequentially stored in the memory cells B1 to Bm. The writing unit 30 may cause the voltage to be sequentially applied to the memory cells B1 to Bm through the DC counter so that the logic states are written therein. Here, one or more DC counters may be connected to the bit lines to which the memory cells B1 to Bm are connected, and control selective writing. Thereafter, in the reading step, the controller 20 causes the reading unit 40 to determine the synaptic weights through the sum of the currents flowing through the memory cells B1 to Bm, namely, the synaptic elements. The reading unit 40 may include an ADC to measure the sum of the currents at one time, and when the selected cells are all connected to one word line, the ADC may be connected to the word line to assist the sum of the currents to be measured. Such an ADC may be a sense amplifier.

FIG. 5C shows a structure in which memory cells that are selected to have the logic states written therein, namely, memory cells C1 to Cpk forming one synaptic element are all connected to a plurality of word lines and a plurality of bit lines. In this way, with respect to the memory cells C1 to Cpk forming one synaptic element, the controller 20, in the writing step, sequentially applies a voltage through a plurality of word lines WLC1 to WLCk and a plurality of bit lines BLC1 to BLCp that are connected to the memory cells C1 to Cpk, and has the logic states stored in the memory cells C1 to Cpk. The writing unit 30 may cause the voltage to be sequentially applied to the memory cells C1 to Cpk through the DC counter and write the logic states therein. Here, one or more DC counters may be connected to the bit lines and the word lines to which the memory cells C1 to Cpk are connected, and control selective writing. Thereafter, in the reading step, the controller 20 causes the reading unit 40 to measure the sum of currents flowing through the memory cells C1 to Cpk, namely, synaptic elements so as to determine synaptic weights. The reading unit 40 may include an ADC to measure the sum of the currents at one time, and when the selected cells are connected to a plurality of word lines and bit lines, the ADC may also be connected to the word lines and the bit lines to assist the sum of the currents to be measured. Such an ADC may be a sense amplifier.

The present invention provides a method for determining synaptic weights, in a memory apparatus including a memory array provided with a plurality of memory cells that may selectively store logic states, and bit lines and word lines connected to the plurality of memory cells, the method including: (a) a step for selecting one or more memory cells from among the plurality of memory cells, and sequentially applying a writing voltage to write logic states therein; (b) a step for applying a reading voltage to the one or more memory cells that have been selected to have the logic states written therein; and (c) a step for determining synaptic weights through the sum of currents flowing through the one or more memory cells that have been selected to have the logic states written therein, wherein the selected one or more memory cells are recognized to operate as one synaptic element.

In a memory array of a cross point structure, one or more memory cells are selected, logic states are written therein, synaptic weights are determined through the sum of currents flowing through the memory cells that are selected to have the logic states written therein in this way, and thus the selected one or more memory cells may be recognized to operate as one synaptic element.

The number of the selected memory cells may be determined according to a weight of the synaptic element. In the neuromorphic system, signals $X_1$ to $X_n$ from pre-neurons are input to synapses, and an output signal is output by weighting the input signal according to a weight set for each synapse. For this, it is important to have various weights for the respective synapses. When using the synapses as memory elements, it is necessary to have various conductivities for the respective memory elements so as to have various weights. To this end, in the present invention, various conductivities are shown by configuring one synaptic element with several memory cells instead of one memory cell. For example, when a memory cell may store one bit logic state and 128 synaptic weights are necessary, 128 cells are selected and the selected 128 cells are turned on. Then, 128 synaptic weights may be read by causing a current to flow through the 128 cells in the reading step. Similarly, when 256 synaptic weights are necessary, 256 cells are selected and turned on in the writing step. Then in the reading step, 256 synaptic weights may be read.

When describing this in more detail in FIG. 6, if the input signal of $X_1$ is applied to a synapse $W_1$ and a weight of 128 is set in the synapse $W_1$, 128 cells $C_1$ to $C_{128}$ are turned on for the synaptic weight for $W_1$. The input signal of $X_1$ is applied to the 128 cells and the current output therefrom is measured.

Similarly, if the input signal of $X_2$ is applied to a synapse $W_2$ and a weight of 256 is set in the synapse $W_2$, 256 cells $C_1$ to $C_{256}$ are turned on for the synaptic weight for $W_2$ and the input signal of $X_1$ is applied to the 256 cells and the current output therefrom is measured.

In this way, it is possible to set various synaptic weights by measuring the current flowing through several memory cells at the same time.

Meanwhile, a memory cell may be a memory apparatus capable of storing one bit or more logic states. When the logic state is not simply on or off but has multiple stages, a larger synaptic weight may be represented even when the selected number of memory cells is small. For example, when each memory cell represents only on or off, the number of the selected memory cells required to represent 256 synaptic weights is 256. On the other hand, when the memory cell is formed of a variable resistance element and may represent a four-stage resistance state, 256 synaptic weights may be represented with 64 memory cells.

In addition, in the present invention, one or more memory cells capable of selectively storing the logic states provide, in a memory apparatus including a two-terminal switching element or a selective memory element, a method for determining synaptic weights, wherein, in the above-described step (b), the reading voltage is in a range in which all the one or more memory cells, which has been selected to have the logic states written therein, are not turned on, and which is larger than a voltage applied to one or more memory cells that are not selected from the memory array.

The two-terminal switching element or the selective memory element has a switching function in which a large resistance change occurs, when a voltage equal to or greater than a certain level is applied. A voltage causing a change in resistance in this two-terminal switching element or selective memory element is expressed as a threshold voltage, and a phenomenon in which the resistance change occurs is expressed as being turned on.

A typical reading procedure in which a switching function is used in a memory array of a cross point structure like the present invention is performed by causing only a very low current to flow through a cell that is not selected at a threshold voltage or lower using the characteristics of a switching element, and by applying, to a selected cell, a voltage that may allow a logic state of the cell to be distinguished.

A typical method for reading currents of selected cells in a memory array of a cross point structure including a two-terminal switching element or a selective memory element will be described through FIG. 7. In FIG. 7, when $V_{inh}$ is applied to the cells that are not selected, in this region, cells having high resistance are not distinguished from cells having low resistance and the flow of a current is very small. Meanwhile, $V_{read1}$ is applied to the selected cells, and $V_{read1}$ is caused to be $V_{th\_A} < V_{read1} < V_{th\_B}$ where $V_{th\_A}$ is a threshold voltage of the cells having low resistance, $V_{th\_B}$ is a threshold voltage of the cells having high resistance, and the logic state is allowed to be distinguished by means of a current flowing through the selected cells. In FIG. 7, according to $V_{read1}$, a current $I_{target,off}$ flows through the cells having the high resistance and a current $I_{target,on}$ flows through the cells having the low resistance. This method may allow only one cell to be selected from the memory array and allow only an on or off state in a digital type to be read. This is because, when the reading voltage is applied to one cell that is in a turned-on state, a current flowing through the cell is so large that current measurement for other cells is not possible.

Another method for reading the currents of the selected memory cells will be described with reference to FIG. 8. When $V_{inh}$ is applied to the cells that are not selected, in this area, current flows according to resistance states of the cells are not distinguished from each other and the currents are very small. Meanwhile, unlike the above-described method for applying, to the selected cells, the reading voltage $V_{read1}$ ($V_{th\_A}<V_{read1}<V_{th\_B}$) between the threshold voltage $V_{th\_A}$ of the cells having the low resistance and the threshold voltage $V_{th\_B}$ of the cells having the high resistance, as shown in FIG. 8 with '$V_{read2}$', the reading voltage is within a voltage range of a sub-threshold region in which all the selected one or more cells are not turned on and within a range larger than the voltage applied to the one or more cells that are not selected. In other words, in FIG. 8, the reading voltage $V_{read2}$ is larger than $V_{inh}$ and in a range smaller than the threshold voltage $V_{th1}$ of a cell that is in a lowest resistance state among the selected cells. In this way, when the reading is performed in the sub-threshold region, simultaneous reading for multiple cells also becomes possible. This is because, unlike the typical method, even when the reading voltage is applied to a cell in an on state, a current flowing through the cell is not large and thus the sum of currents flowing through multiple cells may be easily measured by applying the reading voltage to the multiple cells simultaneously.

In the present invention, the two-terminal switching element may be any one among an Ovonic threshold switching element, a transition metal oxide switching element, a mixed ion-electron conductor switching element, a complementary resistance switching element, and doped amorphous silicon. Besides the above-described materials, a material in which a switching function is enabled which causes a resistance change on the basis of a threshold voltage is also adoptable.

Alternatively, the selective memory element means an element having both non-volatile memory characteristics and selector element characteristics. In other words, it means to be able to store a logic state through a resistance change and also operate as a selector element by causing a resistance change on the basis of a constant voltage, namely, a threshold voltage. Such an element may be represented as a selective memory element, and in this case, an additional memory element or a selector element is not necessary. Accordingly, a high density memory apparatus is enabled and power consumption may be reduced. An example of such a selective memory element may be an Ovonic threshold switching element including a chalcogenide material. This is because the chalcogenide threshold switching element may be solely utilized to show both the variable resistance characteristics and the selection function, although typically being connected with an RRAM, PRAM or the like to be used as a selector element. As the chalcogenide material, an In—Ge—As—Se alloy, a Te—Se alloy, an As—Se alloy, a Ge—Te alloy, a Ge—Se alloy, an As—Se—Te alloy, a Ge—As—Se alloy, a Ge—As—Sb alloy, a Ge—Sb—Te alloy, a Ge—Sb—Se alloy, a Ge—As—Te alloy, a Si—Ge—As—Se alloy, a Si—Te—As—Ge alloy, an In—Sb—Te alloy, an In—Sb—Se alloy, an In—Ge—As alloy, an In—Ge—Te alloy, an In—Te alloy, or the like may be used. However, besides the above-described materials, a material through which a logic state may stored and a switching function is enabled by a resistance change is also adoptable.

In addition, the plurality of memory cells capable of selectively storing the logic states provide, in a memory apparatus including a two-terminal switching element or a selective memory element, a method for determining synaptic weights, wherein, in the above-described step (a), the writing voltage turns on the one or more memory cells selected from among a plurality of memory cells and has a first polarity for writing a first logic state and a second polarity for writing a second logic state, the first polarity and the second polarity being opposite to each other, and in the above-described step (b), the reading voltage has the same polarity as the first polarity of the writing voltage, wherein the selected one or more selected memory cells are caused to be recognized to operate as one synaptic element.

When a voltage of the first polarity, which is equal to or higher than the threshold voltage, is applied to a memory cell including the two-terminal switching element or the selective memory element, and then the voltage of the first polarity is applied thereto, the memory cell has a low threshold voltage in a direction of the first polarity to show a low resistance state. Initially, even in case of having a high threshold voltage of the first polarity and being in a high resistance state, when a voltage of the first polarity equal to or greater than the threshold voltage is applied, the memory cell also becomes a low resistance state. In addition, when a voltage equal to or greater than the threshold voltage, which has the second polarity opposite to the first polarity, is applied to the memory cell, and then the voltage of the first polarity is applied, the memory cell has a high threshold voltage in a direction of the first polarity and shows a high resistance state. Even in case of having the first polarity and being in a low resistance state before a voltage of the second polarity is applied, when the threshold voltage or higher of the second polarity is applied, the memory cell becomes to have a high threshold voltage in the first polarity direction.

This is shown in FIG. 9. In the voltage-current graph in FIG. 9A, when a first forward turn-on voltage $V_t$ of the first polarity (+) is applied along a line 101 and then a reading voltage of the same first polarity (+) is applied, the memory cell has a low threshold voltage $V_{t,LRS}$ along a line 102, in other words, a low resistance state. However, when a voltage equal to or greater than the threshold voltage, which has the second polarity (−), is applied along a line 103 having the opposite polarity of the first polarity (+), and then the reading voltage of the first polarity (+) is applied, the memory cell shows a high threshold voltage $V_{t,HRS}$ along a line 104 to have a high resistance state. In this way, as the polarity of the writing voltage is differed in the writing step, the resistance state becomes different and the resistance difference may be shown through a memory window 106 in FIGS. 9A and 9B. Thereafter, in the reading step, as the above-described, the currents flowing through the selected memory cells may be measured to determine the synaptic weights by applying the reading voltage within a range 105 in which the memory cells are not turned on and which is larger than a voltage applied to the one or more cells that are not selected from the memory array.

In the present invention, a method for determining synaptic weights may be provided in which one or more memory cells that are selected to have the logic states written therein are memory cells all connected to one bit line among the bit lines. In addition, in the present invention, a method for determining synaptic weights may be provided in which the one or more memory cells that are selected to have the logic states written therein are memory cells all connected to one word line among the word lines. The memory cells selected in this way are connected to one word line or one bit line, which is efficient in terms of apparatus configuration.

Furthermore, the present invention provides a method for determining synaptic weights in which the number of one or more memory cells, which are selected to have the logic states written therein in the (a) step, is any one among 1, 2, 4, 8, 16, 32, 64, 128, 256, 1024, and 2048, wherein the selected one or more memory cells are recognized to operate as one synaptic element. This is because the number of selected cells is preferably $2^n$ on the basis of the binary system that is based in a computer. Accordingly, the number of selected cells is preferably any one among 1, 2, 4, 8, 16, 32, 64, 128, 256, 1024, and 2048. In case of exceeding 2048, the number of the cells selected from the array is too many, and thus a control therefor becomes difficult. Thus the number of the selected cells is preferably 2048 or smaller.

In the present invention, a new neuromorphic system and an operation method thereof will be described. In deep learning algorithm, a vector-matrix multiplication (VMM) operation is a key computing operation for training and inference.

When the VMM method for recognizing an image is described with reference to FIG. 10, the image is divided into N×N regions, weights are respectively set on the N×N regions, and information such as brightness and darkness is input as various input signals. When expressing this with a neuromorphic system, an input signal $X_i$ is a signal from a pre-neuron, an output current $I_{tot}$ is an output signal to a post-neuron, and $W_i$ is a weight that is multiplied by the input signal through a synapse. In this way, the image is recognized by comparing $I_{tot}$, which is the current resulting from the sum of the products of the input signal and the weight, with a reference value and finding the synapse having the closest weight.

However, there are many problems in realizing such an operation in an existing computing system, such as the problem of power consumption and the problem of the size of the apparatus.

In order to solve this problem, recent studies are actively trying to solve this problem by using a cross point structure using new memories such as the resistive random access memory (RRAM), the phase change random access memory (PRAM), and the magnetic random access memory (MRAM).

The memory array of the cross point structure has a structure in which the input electrode line and the output electrode line cross each other, and the input electrode line and the output electrode line are connected through the memory cell at a cross-point where the input electrode line and the output electrode line cross each other.

The VMM using the memory array of the cross point structure has been described in FIG. 11. In FIG. 11, when an input signal that can be expressed as a vector $X_i$ is applied to a row metal line 122 while maintaining a column metal line 121 in a grounded state, the current flowing through each memory at a cross-point (i, j) position becomes $X_iW_{ij}$. Since the current flowing through these column lines 121 becomes the sum of the currents flowing through the memories positioned in the same column line 121, $I_j = +X_1 * W_{1j} + X_2 * W_{2j} + X_3 * W_{3j} + \ldots + X_n * W_{nj}$ (j is 1 to m in FIG. 11).

In this way, an inference process is performed by comparing each of the m currents output through the column line 121 with a reference value.

Here, the input signal $X_i$ may be a pulse having a constant width and different heights, a pulse having a constant height and different widths, or a pulse having a constant width and height and different number of times. $W_{ij}$, which is a weight, can be expressed with the conductivity of the memory at each point of the memory array of the cross point structure.

By the way, here, the weight $W_{ij}$ corresponds to the conductivity of the memory. In order to increase the accuracy of inference, various values, that is, various conductivity, needs to be stored in the memory step by step. As the diversity increases, the accuracy of inference also increases, and thus, for this purpose, a new memory capable of storing conductivities at various stages is actively developed, but satisfactory results have not yet been obtained.

In order to improve this result, the present invention can provide a new neuromorphic system capable of exhibiting various conductivities $W_{ij}$ using a plurality of memory cells instead of one memory cell, and a method of using the same. That is, the weight is not represented by configuring the synapse with one memory cell, but various weights can be set freely by configuring the synapse with a plurality of memory cells. Through the novel neuromorphic system provided by the present invention and a method of using the same, $W_{ij}$, which is a weight corresponding to an individual input value, is represented using a plurality of cells rather than one memory cell, and various conductivity can be expressed by setting an amplification factor according to the number of digits in each of the plurality of cells. The amplification factor may follow the number of digits in the binary number system.

This is simplified and expressed in FIG. 12. FIG. 12A illustrates a neuromorphic system including an input signal unit 200, a synaptic section 300, which includes a plurality of synaptic units 310 and a multiplier 320 capable of amplifying the current flowing through these synaptic units and to which an input signal generated from the input signal unit 200 is applied, and an output signal unit 400 measuring a current flowing through the synaptic section 300.

In such a neuromorphic system, each of the synaptic units 310 positioned in the synaptic section 300 includes a plurality of memory cells 311 and an amplification factor is set in each of these memory cells 311, and the current flowing through these memory cells is amplified by the multiplier 320 by the amplification factors, so that the sum of these amplified currents may eventually become a current flowing through the synapse unit 310. As the plurality of memory cells to which amplification factors are set are included in one synaptic unit 310, various weights can be expressed.

In this case, various shapes may appear depending on the positions of the plurality of memory cells and the connection of the multiplier for amplifying the current.

First, a plurality of memory cells included in one synaptic unit may be positioned in different memory arrays. In this case, an amplification factor is set in each memory array, so that all memory cells positioned in the same memory array have the same amplification factor. One multiplier is connected to one memory array. Through this connection, the memory cells included in one synaptic unit are dispersedly positioned in several memory arrays, and the weight is determined by the sum of the currents flowing through the memory cells.

This will be described in more detail with reference to FIG. 13. As in the general neuromorphic system of the cross point structure, the input signal $X_i$ passes through the synaptic units $W_{11}$ to $W_{n1}$ having weights to output an output signal. Here, the synaptic unit is conventionally configured with one memory cell, whereas in the present invention, the synaptic unit is configured with a plurality of memory cells, and the plurality of memory cells are again disposed in a plurality of memory arrays. Although k memory arrays are represented in FIG. 13, the number of memory arrays may be variously taken, such as 2, 4, 16, 32, 64, etc. as needed.

Amplification factors m.f(1) to m.f(k) are respectively set for the plurality of memory arrays, and the amplification factor may be $2^n$ (n includes 0 and a positive integer) to represent the number of digits in the binary number system. For example, in FIG. 12, the number of memory arrays is 8. Accordingly, m.f(1) is $2^7$, m.f(2) is $2^6$, m.f(3) is $2^5$, and the last m.f(8) can be $2^0$.

In FIG. 13, the synaptic unit $W_{11}$ is configured with k memory cells $A_1C_{11}, A_2C_{11}, A_3C_{11}, \ldots, A_kC_{11}$. When the input signal $X_1$ is input to each of the k memory cells, currents $X_1*A_1C_{11}, X_1*A_2C_{11}, X_1*A_3C_{11}, \ldots, X_1*A_kC_{11}$ are respectively generated in the k memory cells.

The generated currents are respectively amplified by multipliers mp(1) to mp(k) respectively connected to the memory arrays with the amplification factors m.f(1) to m.f(k) which are respectively set according to the memory arrays in which the memory cells are respectively positioned, and eventually shows the following output signal.

$$X_1 W_{11} = X_1*(A_1C_{11}*m.f(1) + A_2C_{11}*m.f(2) + \ldots + A_kC_{11}*m.f(k))$$

Finally, the output signal $I_1$ that can be used for inference can be obtained as follows by summing the output signals of n synaptic units, which is shown in FIG. 14.

$$I_1 = X_1*W_{11} + X_2*W_{21} + X_3*W_{31} + \ldots + X_n*W_{n1} =$$
$$X_1*(A_1C_{11}*m.f(1) + A_2C_{11}*m.f(2) + \ldots + A_kC_{11}*m.f(k)) +$$
$$X_2*(A_1C_{21}*m.f(1) + A_2C_{21}*m.f(2) + \ldots + A_kC_{21}*m.f(k)) + \ldots +$$
$$X_n*(A_1C_{n1}*m.f(1) + A_2C_{n1}*m.f(2) + \ldots + A_kC_{n1}*m.f(k))$$

As such, it is necessary to amplify the current flowing through each of the memory cells of each synaptic unit according to the amplification factor and sum the currents. As a result, the resultant value becomes equal to the value obtained by amplifying the value $X_1*A_kC_{11} + X_2*A_kC_{21} + \ldots + X_n*A_kC_{n1}$, which is the sum of the currents each of which flows through the same output electrode line for each memory array, by the multiplier mp(k) by the amplification factor m.f(k) which is set in the memory array, and summing the amplified values. Therefore, it can be represented again as follows.

$$I_1 = (X_1*A_1C_{11} + X_2*A_1C_{21} + \ldots + X_n*A_1C_{n1})*m.f(1) +$$
$$(X_1*A_2C_{11} + X_2*A_2C_{21} + \ldots + X_n*A_2C_{n1})*m.f(2) +$$
$$\ldots + (X_1*A_kC_{11} + X_2*A_kC_{21} + \ldots + X_n*A_kC_{n1})*m.f(k)$$

When describing in more detail the operation method using such a neuromorphic system including a plurality of memory arrays, the operation method may include (a) setting an amplification factor for each of the plurality of memory arrays; (b) selecting and combining one or more memory cells from each of the plurality of memory arrays for which the amplification factor is set, and setting the plurality of synaptic units including the plurality of memory cells; (c) applying an input signal to the plurality of synaptic units; (d) measuring currents flowing through the memory cells of the synaptic unit by the applied input signal for each memory array; and (e) amplifying the current measured for each memory array according to the set amplification factor of the memory array, and measuring a sum of the currents amplified in the respective memory arrays.

The amplification factors m.f(1) to m.f(k) are respectively set for the memory arrays, and the memory cells are selected from the memory arrays and combined to set a plurality of synaptic units. In FIG. 14, the synaptic unit $W_{11}$ becomes a combination of $A_1C_{11}, A_2C_{11}, A_3C_{11}, \ldots, A_kC_{11}$, $W_{21}$ becomes a combination of $A_1C_{21}, A_2C_{21}, A_3C_{31}, \ldots, A_kC_{21}$, and the last $W_{n1}$ becomes a combination of $A_1C_{n1}, A_2C_{n1}, A_3C_{n1}, \ldots, A_kC_{n1}$.

When the input signals $X_1$ to $X_n$ are applied to the synaptic units set in this way, the currents flow in the memory cells included in each of these synaptic units. For example, the currents of $X_1*A_1C_{11}, X_1*A_2C_{11}, X_1*A_3C_{11}, \ldots, X_1*A_kC_{11}$ flow through the memory cells $A_1C_{11}, A_2C_{11}, A_3C_{11}, \ldots, A_kC_{11}$ included in the synaptic unit $W_{11}$, respectively.

In this way, the currents flowing through the individual memory cells of the synaptic unit are measured and added for each memory array. That is, in FIG. 14, the sum of the currents flowing through the memory array $A_1$ is $X_1*A_1C_{11} + X_2*A_1C_{21} + \ldots + X_n*A_1C_{n1}$. When the sum of the measured and added currents is multiplied by the amplification factor set for each memory array $((X_1*A_1C_{11} + X_2*A_1C_{21} + \ldots + X_n*A_1C_{n1})*m.f(1))$ and the sum of the amplified currents in each of the memory arrays A1 to Ak is measured, $I_1$, which is a current value necessary for inference, is derived.

On the other hand, when the memory cell includes a two-terminal switching element or the selective memory device and the sum of currents flowing through one memory array is measured, when one memory cell is turned on because it is in a low resistance state a large current flows in the turned-on memory cell, and accordingly, a large voltage drop occurs, making it impossible to read a change in current in the other memory cells. Therefore, when the input signal is in a voltage range in which the memory cell can change to the low resistance state (see FIG. 7), it is necessary to proceed in such a way that inputs of input signals and output signals according to the input signal are sequentially measured for the memory cells one by one in one memory array, and then the sum thereof is obtained. To this end, the memory array may further include a capacitor capable of storing a current flowing for each output line.

On the other hand, even when the memory cell includes the two-terminal switching element or the selective memory element and the sum of the currents flowing through one memory array is measured, the voltage of the input signal may be set in a range in which both the memory cell in a high resistance state and the memory cell in the low resistance state formed by the characteristics of the two-terminal switching element or the selective memory element are not turned on (see FIG. 8). According to this, since there are no turned-on memory cells, overall power consumption can be reduced, and since the voltage drop does not occur significantly, the currents flowing through one memory array can be simultaneously measured.

In order to obtain a different current value $I_j$, the above method is repeated for each output line of each memory array as illustrated in FIG. 15. The closest current value is determined by comparing the thus derived current values $I_1$ to $I_m$ with a reference value by a constant function.

In addition, in the present invention, the plurality of memory cells may be positioned in one memory array. Also, in this case, it may be a neuromorphic system in which the memory array has the cross point structure which includes the input electrode lines and the output electrode lines crossing each other, the multiplier is connected to each of the output electrode lines, the plurality of memory cells of the synaptic unit are positioned in the plurality of output electrode line, the amplification factor is set for each output electrode line, and the same amplification factor is set to all of the memory cells positioned in the same output electrode line, and the current flowing by the input signal in each of the memory cells of the synaptic unit is amplified by the multiplier according to the amplification factor.

As described above, n input signals $X_1$ to $X_i$ pass through n synaptic units $W_{11}$ to $W_{n1}$ having weights to output the output signals, as in the general neuromorphic system of the cross point structure. Here, in the present invention, the synaptic unit is configured with a plurality of memory cells, and the plurality of memory cells may be disposed for each output line in one memory array.

This is illustrated in FIGS. 16 and 17, the synaptic unit $W_{11}$ is to include a plurality of memory cells $L_1C_{11}$, $L_2C_{11}$, ... $L_kC_{11}$. The amplification factors m.f(1) to m.f(k) are respectively set to the output electrode lines on each of which the plurality of memory cells are disposed, and accordingly multipliers m.p(1) to m.p(k) are respectively connected the output electrode lines. Here again, the amplification factor may be $2^n$ (n is a positive integer including 0) to represent the number of digits in the binary system. For example, in FIGS. 16 and 17, the number k of output electrode lines having different amplification factors is 8. Accordingly, m.f(1) is $2^7$, m.f(2) is $2^6$, m.f(3) is $2^5$, and the last m.f(8) can be $2^0$.

FIG. 16 illustrates a case in which output electrode lines having the same amplification factor are gathered together, and FIG. 17 illustrates a case in which the multiplier is disposed for each output electrode line because the amplification factor is different for each neighboring output electrode line.

In FIG. 16, the synaptic unit $W_{11}$ is configured with k memory cells $L_1C_{11}$, $L_2C_{11}$, $L_kC_{11}$, and when an input signal $X_1$ is input to each of the k memory cells, the currents $X_1*L_1C_{11}$, $X_1*L_2C_{11}$, $L_3C_{11}$, ..., $X_1*L_kC_{11}$ are respectively generated in the k memory cells accordingly.

Again, the currents of $X_2*L_1C_{21}$, $X_2*L_2C_{21}$, $X_2*L_3C_{21}$, ..., $X_2*L_kC_{21}$ are respectively generated in the memory cells of $W_{21}$, which is the synaptic unit.

This generated current is amplified by the amplification factor which is set according to the output electrode line in which the memory cells are respectively positioned, and eventually, the output signal is as follows by the synapse unit $W_{11}$.

$$X_1W_{11} = X_1*(L_1C_{11}*m.f(1) + L_2C_{11}*m.f(2) + ... + L_kC_{11}*m.f(k))$$

Finally, the output signal $I_1$ that can be used for inference can be obtained as follows by summing the output signals of individual synaptic units, which is illustrated in FIG. 16.

$$I_1 = X_1*W_{11} + X_2*W_{21} + X_3*W_{31} + ... + X_n*W_{n1} =$$
$$X_1*(L_1C_{11}*m.f(1) + L_2C_{11}*m.f(2) + ... + L_kC_{11}*m.f(k)) +$$
$$X_2*(L_1C_{21}*m.f(1) + L_2C_{21}*m.f(2) + ... + L_kC_{21}*m.f(k)) + ... +$$
$$X_n*(L_1C_{n1}*m.f(1) + L_2C_{n1}*m.f(2) + ... + L_kC_{n1}*m.f(k))$$

As such, it is necessary to amplify the current flowing through each memory cell of each synaptic unit according to the amplification factor and sum the currents. As a result, the resultant value becomes equal to the value obtained by amplifying the value $X_1*A_kC_{11}+X_2*A_kC_{21}+ ... + X_n*A_kC_{n1}$, which is the sum of the currents each of which flows through the same output electrode line for each memory array, by the amplification factor m.f(k) which is set in the memory array and summing the amplified values.

$$I_1 = (X_1*A_1C_{11} + X_2*A_1C_{21} + ... + X_n*A_1C_{n1})*m.f(1) +$$
$$(X_1*A_2C_{11} + X_2*A_2C_{21} + ... + X_n*A_2C_{n1})*m.f(2) +$$
$$... + (X_1*A_kC_{11} + X_2*A_kC_{21} + ... + X_n*A_kC_{n1})*m.f(k)$$

As illustrated in FIG. 16, the output electrode lines having the same amplification factor in one memory array may have different amplification factors for each neighboring electrode line, unlike the case where the output electrode lines are adjacent to each other, which is expressed in FIG. 17.

When describing the operation method using the neuromorphic system, in which one synaptic unit includes a plurality of memory cells and the plurality of memory cells are positioned in one memory, in more detail, the operation method may be a method of operation of the synaptic device for a neuromorphic system including: (a) setting an amplification factor for each output electrode line of the memory array; (b) selecting and combining one or more memory cells connected to the output electrode line for which the amplification factor is set, and setting the plurality of synaptic units including the plurality of memory cells; (c) applying an input signal to the plurality of synaptic units; (d) measuring the current flowing through the memory cells of the synaptic unit by the applied input signal for each output electrode line; and (e) amplifying the current measured for each output line according to the set amplification factor of the output electrode line, and measuring a sum of the currents amplified in the respective output electrode lines.

The amplification factors m.f(1) to m.f(k) are respectively set for the output electrode lines. Here, a plurality of synaptic units are set by selecting and combining memory cells. In FIG. 16, the synaptic unit $W_{11}$ is a combination of $L_1C_{11}$, $L_2C_{11}$, $L_3C_{11}$, ..., $L_kC_{11}$.

When the input signals $X_1$ to $X_n$ are applied to the synaptic units set in this way, the currents flow in the memory cells included in each of these synaptic units. For example, the currents of $X_1*L_1C_{11}$, $X_1*L_2C_{11}$, $X_1*L_3C_{11}$, ..., $X_1*L_kC_{11}$ flow through the memory cells $L_1C_{11}$, $L_2C_{11}$, $L_3C_{11}$, ..., $L_kC_{11}$ included in the synaptic unit $W_{11}$, respectively.

In this way, the currents flowing through the individual memory cells of the synaptic unit are measured and added for each output electrode line. That is, in FIG. 16, the sum of the currents flowing through the memory output electrode line $L_{1-1}$ is $X_1*L_1C_{11}+X_2*L_1C_{21}+...+X_n*L_1C_{11}$. When the sum of the measured and added currents is multiplied by the amplification factor set for each output electrode line $((X_1*L_1C_{11}+X_2*L_1C_{21}+ ... +X_n*L_1C_{n1})*m.f(1))$ and the sum of the amplified currents in each of the output electrode lines $L_{1-1}$ to $L_{k-1}$ is measured, $I_1$, which is a current value necessary for inference, is derived.

On the other hand, when the memory cell includes the two-terminal switching element or the selective memory device and the sum of currents flowing through one output electrode line is measured, when one memory cell is turned on because it is in a low resistance state, a large current flows in the turned-on memory cell, and accordingly, a large voltage drop occurs, making it impossible to read a change in current in the other memory cells on the same output electrode line. Therefore, when the input signal is in a voltage range in which the memory cell can change to the low resistance state (see FIG. 7), it is necessary to proceed in such a way that inputs of input signals and output signals according to the input signal are sequentially measured for the memory cells one by one in output electrode line, and then the sum thereof is obtained. To this end, the memory array may further include a capacitor capable of storing a current flowing for each output line.

On the other hand, even when the memory cell includes the two-terminal switching element or the selective memory element and the sum of the currents flowing through one output electrode line is measured, the voltage of the input signal may be set in a range in which both the memory cell in a high resistance state and the memory cell in the low resistance state formed by the characteristics of the two-terminal switching element or the selective memory element are not turned on (see FIG. 8). According to this, since there are no turned-on memory cells, overall power consumption can be reduced, and since the voltage drop does not occur significantly, the sum of currents flowing through the memory cells on one output electrode line can be measured at one time.

In addition, in order to obtain a different current value $I_j$, the above method is repeated for each output line of each memory array as illustrated in FIG. 17. The closest current value is determined by comparing the thus derived current values $I_1$ to $I_m$ with a reference value by a constant function.

In addition, in the present invention, the plurality of memory cells capable of storing the logic states may be a memory apparatus capable of storing a logic state of one bit or more. When the logic state is not just on or off, but has several stages, a large synaptic weight may be represented even when the number of memory cells is small.

Each of the plurality of memory cells, which may store the logic state, may include the non-volatile memory element and the selector element. The use of non-volatile memory is required necessary so as to store the logic state at low power in a memory cell, and each of the memory cells requires to include the selector element in order to sequentially select memory cells and write the logic states thereto in the writing step, and measure the sum of the currents flowing through the programmed memory cells in the reading step.

The non-volatile memory element may be any one among the Flash Memory, the resistive random access memory (RRAM), the phase change random access memory (PRAM), or the magnetic random access memory (MRAM). In particular, the non-volatile memory element may be a variable resistance element such as the RRAM, the PRAM, or the MRAM. This variable resistance element may represent various resistance states according to an applied input signal, and store the logic states of one or more bits through the same.

Furthermore, the selector element may be a memory apparatus that is any one among a transistor, a diode, or a two-terminal switching element. Each memory cell may be individually selected through the selector element included therein and subjected to the writing and reading steps.

In particular, the selector element may be the two-terminal switching element. Application of the two-terminal switching element as the selector element for selecting the memory cell may increase the degree of integration and reduce power consumption. The two-terminal switching element may be any element such as an ovonic threshold switch, a transition metal oxide switch, a mixed ionic electronic conductor (MIEC) switch, a complementary resistive switch, doped amorphous silicon, etc.

In addition, in the present invention, the plurality of memory cells capable of storing the logic state may each include a selective memory element. The selective memory element means an element having both the non-volatile memory characteristics and the selector element characteristics. The selective memory element means one capable of storing a logic state by a change in resistance and, at the same time, operating as a selector element by causing a change in resistance based on a constant voltage, that is, a threshold voltage.

For example, in the case of the ovonic threshold switch made of a chalcogenide material, different resistance states can be created by applying writing voltages with different polarities. A chalcogenide material without a phase change may also be a variable resistance element, and have unique switch characteristics that cause a constant resistance change to occur around a threshold voltage.

In this way, when a variable resistance element is used which includes the chalcogenide material without the phase change like the existing Ovonic threshold switch element, one or more memory cells may be selected through the switching characteristics and each logic state may be stored therein through the variable resistance characteristics.

Such an element may be represented as a selective memory element, and in this case, an additional memory element or a selector element is not necessary. Accordingly, a high density memory apparatus is enabled and power consumption may be reduced. As such a chalcogenide material, an In—Ge—As—Se alloy, a Te—Se alloy, an As—Se alloy, a Ge—Te alloy, a Ge—Se alloy, an As—Se—Te alloy, a Ge—As—Se alloy, a Ge—As—Sb alloy, a Ge—Sb—Te alloy, a Ge—Sb—Se alloy, a Ge—As—Te alloy, a Si—Ge—As—Se alloy, a Si—Te—As—Ge alloy, an In—Sb—Te alloy, an In—Sb—Se alloy, an In—Ge—As alloy, an In—Ge—Te alloy, an In—Te alloy, or the like may be used. However, besides the above-described materials, any material which is capable of storing a logic state and with which a switching function can be performed by resistance change is not particularly limited.

In addition, in the present invention, the output signal unit may include an analog-to-digital converter, and the sum of the currents received from the output signal unit is an analog signal, which can be digitized through the analog to digital converter and output. This analog-to-digital converter may be a sense amplifier.

The invention claimed is:
1. A neuromorphic system comprising:
an input signal unit that generates an input signal;
a synaptic section that includes a plurality of synaptic units receiving the signal of the input signal unit and generating a current according to a set weight and a multiplier amplifying the current generated in the synaptic unit; and
an output signal unit that generates an output signal by receiving the current generated from the synaptic section, wherein each of the synaptic units includes a plurality of memory cells connected to each other and capable of selectively storing logic states, an amplification factor is set in each of the plurality of memory cells, and the current flowing through the plurality of memory cells by the input signal is amplified by the multiplier by the amplification factor, wherein the plurality of memory cells of the synaptic unit are positioned in a plurality of memory arrays, the plurality of memory arrays have cross point structures including an input electrode lines and an output electrode lines crossing each other, the multiplier is connected to each of the plurality of memory arrays, the amplification factor is set in each of the plurality of memory arrays, and the same amplification factor is set for all memory cells included in the same memory array, and a current flowing by an input signal in each of the plurality of memory cells of the synaptic unit is amplified by the multiplier according to the amplification factor.

2. A neuromorphic system comprising:

an input signal unit that generates an input signal;

a synaptic section that includes a plurality of synaptic units receiving the signal of the input signal unit and generating a current according to a set weight and a multiplier amplifying the current generated in the synaptic unit; and an output signal unit that generates an output signal by receiving the current generated from the synaptic section, wherein each of the synaptic units includes a plurality of memory cells connected to each other and capable of selectively storing logic states, an amplification factor is set in each of the plurality of memory cells, and the current flowing through the plurality of memory cells by the input signal is amplified by the multiplier by the amplification factor, wherein the plurality of memory cells of the synaptic unit are positioned in one memory array, the memory array has a cross point structure including an input electrode line and an output electrode line crossing each other, and the multiplier is connected to each of the output electrode lines, the plurality of memory cells of the synaptic unit are positioned on the plurality of output electrode lines, an amplification factor is set for each output electrode line, and the same amplification factor is set for all of the memory cells positioned on the same output electrode line, and a current flowing by an input signal in each of the memory cells of the synaptic unit is amplified by the multiplier according to the amplification factor.

3. The neuromorphic system of claim 1, further comprising:

a capacitor storing a current flowing for each output electrode line.

4. The neuromorphic system of claim 1, wherein the number of the plurality of memory arrays is any one of 2, 4, 8, 16, 32 or 64 and the plurality of memory arrays have different amplification factors.

* * * * *